(12) United States Patent
Ohsawa

(10) Patent No.: US 7,502,270 B2
(45) Date of Patent: Mar. 10, 2009

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 11/673,750

(22) Filed: Feb. 12, 2007

(65) Prior Publication Data

US 2007/0223272 A1 Sep. 27, 2007

(30) Foreign Application Priority Data

Mar. 24, 2006 (JP) .............................. 2006-083189

(51) Int. Cl.
*G11C 7/06* (2006.01)
(52) U.S. Cl. ................. 365/205; 365/185.21; 365/210.1
(58) Field of Classification Search .............. 365/210.1, 365/184
See application file for complete search history.

(56) References Cited

U.S. PATENT DOCUMENTS

| | | | | |
|---|---|---|---|---|
| 4,947,376 A | * | 8/1990 | Arimoto et al. .............. 365/205 |
| 5,029,137 A | * | 7/1991 | Hoshi .......................... 365/208 |
| 5,138,578 A | * | 8/1992 | Fujii ............................ 365/203 |
| 5,539,691 A | * | 7/1996 | Kozaru et al. ........... 365/189.05 |
| 5,761,123 A | * | 6/1998 | Kim et al. ............... 365/185.21 |
| 6,026,034 A | * | 2/2000 | Suzuki et al. ................ 365/190 |
| 6,333,883 B2 | * | 12/2001 | Wakayama et al. ......... 365/205 |
| 7,145,811 B2 | | 12/2006 | Ohsawa |
| 7,277,341 B2 | * | 10/2007 | Fujita et al. ................. 365/206 |
| 2006/0274590 A1 | | 12/2006 | Fujita et al. |

FOREIGN PATENT DOCUMENTS

JP    2005-302234    10/2005

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

This disclosure concerns a memory including a memory cell including a floating body in an electrically floating state and storing data according to the number of majority carriers in the floating body; a word line connected to a gate of the memory cell; a first bit line connected to the memory cell to transmit the data; a second bit line transmitting reference data used to detect the data stored in the memory cell; a first sense node and a second sense node transmitting the data stored in the memory cell and the reference data, respectively; a first short-circuiting switch provided between the first sense node and the second sense node; and a first flip-flop applying a load current to the memory cell during a data read operation and amplifying a potential difference generated between the first sense node and the second sense node by turning off the first short-circuiting switch.

18 Claims, 29 Drawing Sheets

S/Ai

FIRST EMBODIMENT

S/Ai

FIRST EMBODIMENT

DATA READ OPERATION

DATA WRITE OPERATION

SECOND EMBODIMENT

DATA READ OPERATION

THIRD EMBODIMENT

FIFTH EMBODIMENT

DATA READ OPERATION

COMBINATION FO THE FIFTH AND THE SECOND EMBODIMENTS

COMBINATION OF THE FIFTH AND THE THIRD EMBODIMENTS

SIXTH EMBODIMENT

DATA READ OPERATION

SEVENTH EMBODIMENT
S/Ai

DATA READ OPERATION

EIGHTH EMBODIMENT

DATA READ OPERATION

NINTH EMBODIMENT

DATA READ OPERATION

SEMICONDUCTOR MEMORY DEVICE

CROSS-REFERENCE TO RELATED APPLICATION

This application is based upon and claims the benefit of priority from the prior Japanese Patent Applications No. 2006-83189, filed on Mar. 24, 2006, the entire contents of which are incorporated herein by reference.

BACKGROUND OF THE INVENTION

1. Field of the Invention

The present invention relates to a semiconductor memory device and relates to, for example, a sense amplifier for an FBC (Floating Body Cell).

2. Related Art

A sense amplifier employed in a conventional FBC-DRAM includes a current load circuit and a CMOS latch circuit connected to a pair of sense nodes. The sense amplifier including both the current load circuit and the CMOS latch circuit can advantageously ensure accurately detecting data, i.e., can be advantageously robust against irregularity in a threshold voltage among transistors that constitute the sense amplifier. However, since both the current load circuit and the CMOS latch circuit are provided, the circuit scale of the sense amplifier is disadvantageously large. The large circuit scale of the sense amplifier greatly influences the size of the entire semiconductor memory device particularly if the sense amplifier is provided per pair of bit lines.

Furthermore, such a sense amplifier needs to wait until a potential difference between the pair of sense nodes exceeds the irregularity in the threshold voltages among the transistors. Therefore, the sense amplifier has a disadvantage the data detection speed is decreased.

The current load circuit applies a through current to each memory cell via the sense nodes and the bit lines until a signal is sufficiently developed. This disadvantageously increases current consumption of the conventional sense amplifier.

SUMMARY OF THE INVENTION

A semiconductor memory device according to an embodiment of the present invention comprises a first memory cell including a floating body in an electrically floating state and storing data according to the number of majority carriers in the floating body; a word line connected to a gate of the first memory cell; a first bit line connected to the first memory cell to transmit the data stored in the first memory cell; a second bit line transmitting reference data used to detect the data stored in the first memory cell; a first sense node and a second sense node transmitting the data stored in the first memory cell and the reference data, respectively; a first short-circuiting switch provided between the first sense node and the second sense node; and a first flip-flop applying a load current to the first memory cell during a data read operation and detecting a potential difference generated between the first sense node and the second sense node by turning off the first short-circuiting switch.

A semiconductor memory device according to another embodiment of the present invention comprises a first memory cell including a floating body in an electrically floating state and storing data according to the number of majority carriers in the floating body; a word line connected to a gate of the first memory cell; a first bit line connected to the first memory cell to transmit the data stored in the first memory cell; a second bit line transmitting reference data used to detect the data stored in the first memory cell; a first short-circuiting switch provided between the first bit line and the second bit line; and a first flip-flop applying a load current to the first memory cell during a data read operation and detecting a potential difference generated between the first bit line and the second bit line by turning off the first short-circuiting switch.

DETAILED DESCRIPTION OF THE INVENTION

Embodiments of the present invention will be explained below with reference to the accompanying drawings. The present invention is not limited to the embodiments.

FIRST EMBODIMENT

Figure 1:
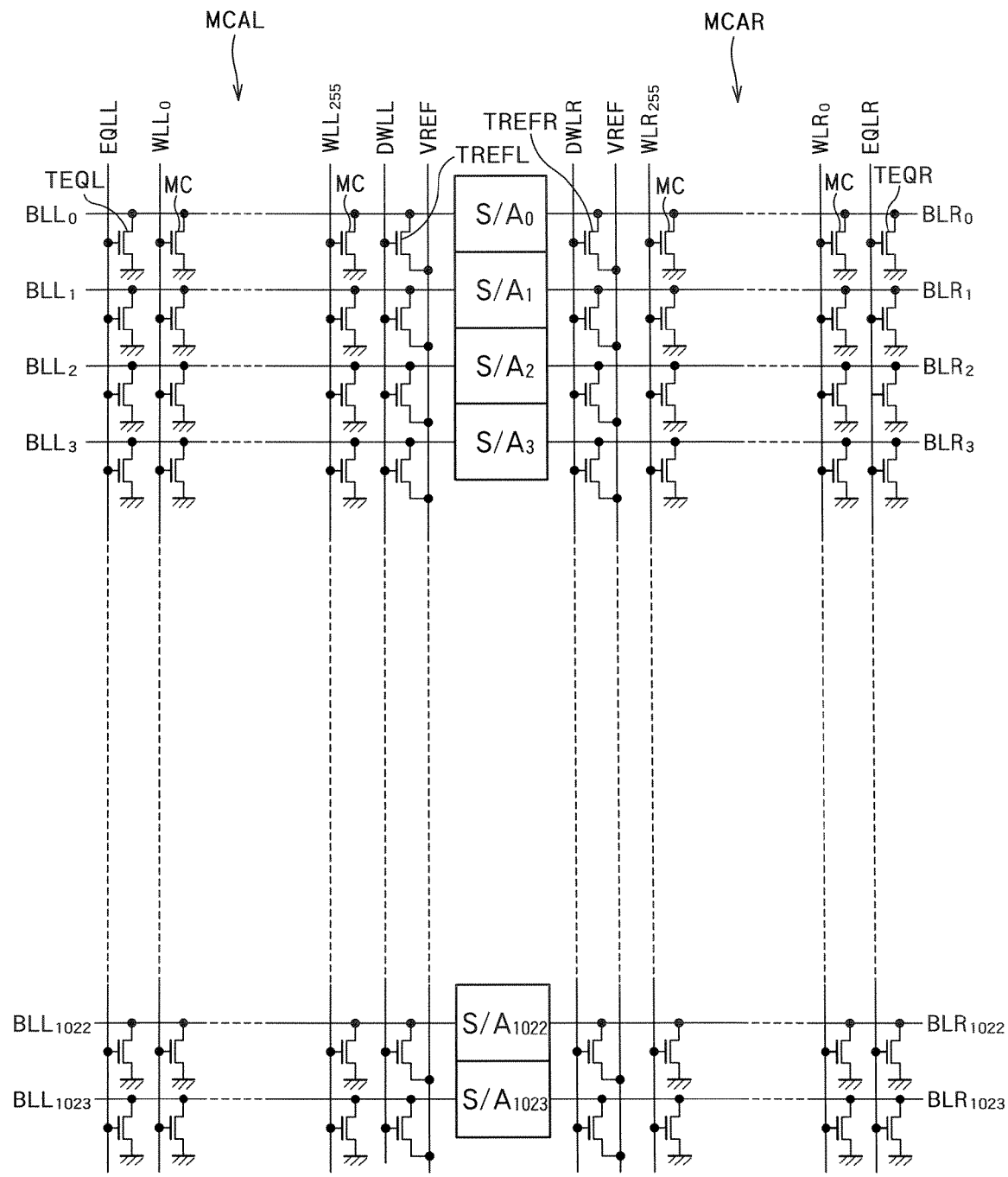
FIG. 1 is a circuit diagram of the configuration of an FBC memory device according to a first embodiment of the present invention.

FIG. 1 is a circuit diagram of the configuration of an FBC memory device according to a first embodiment of the present invention. The FBC memory device includes memory cells MC, sense amplifiers S/Ai (where i is an integer) (hereinafter, also "S/A"), word lines WLLi and WLRi (hereinafter, also "WL"), bit lines BLLi and BLRi (hereinafter, also "BL"), equalizing lines EQLL and EQLR (hereinafter, also "EQL"), equalizing transistors TEQL and TEQR (hereinafter, also "TEQ"), reference potential lines VREF, reference transistors TREFL and TREFR (hereinafter, also "TREF"), and dummy word lines DWLL and DWLR (hereinafter, also "DWL"). It is to be noted that "reference potential" refers to a voltage with which data "1" or "0" is compared when the data "1" or "0" is detected.

The memory cells MC are arranged in a matrix and memory cell arrays MCAL and MCAR (hereinafter, also "MCA") are constituted by the memory cells MC. The word lines WL extend in a row direction and are connected to the gate of each memory cell MC. In the first embodiment, 256 word lines WL are provided on each of the right and left of the sense amplifiers S/A. In FIG. 1, the word lines on the left of the sense amplifiers S/A are denoted by WLL0 to WLL255, respectively, and the word lines on the right of the sense amplifiers S/A are denoted by WLR0 to WLR255, respectively. The bit lines BL extend in a column direction and are connected to the source or the drain of each memory cell MC. 1024 bit lines BL are provided on each of the right and left of the sense amplifiers S/A. In FIG. 1, the bit lines on the left of the sense amplifiers S/A are denoted by BLL0 to BLL1023, respectively, and the bit lines on the right of the sense amplifiers S/A are denoted by BLR0 to BLR1023, respectively. The word lines WL and the bit lines BL are orthogonal to one another and the memory cells MC are provided at respective intersections between the word lines WL and the bit lines BL. The row direction and the column direction can be replaced with each other.

The dummy word lines DWL, the reference transistors TREF, and the reference potential lines VREF are used to transfer a reference potential VREF to the sense amplifiers. A current based on the reference potential VREF is applied from a current mirror to each memory cell MC, and data stored in the memory cell MC is transmitted to sense nodes in the sense amplifier S/A. The sense amplifier S/A determines whether the logic value of the data is "0" or "1" depending on whether the potential of the data-side sense node in the sense amplifier S/A is higher or lower than that of the reference-side sense node. The dummy word lines DWL extend in parallel to the word lines WL in the row direction and are connected to the gate of each reference transistor TREF. One dummy word line DWL is provided on each of the left and right of the sense amplifiers S/A.

The equalizing lines EQL are connected to the gate of each equalizing transistor TEQ. Each equalizing transistor TEQ is connected between each bit line BL and a ground. Equalization is performed by connecting the bit line BL to the ground so that the equalizing transistor TEQ makes the potential of each bit line BL equal to a ground potential.

Figure 2:
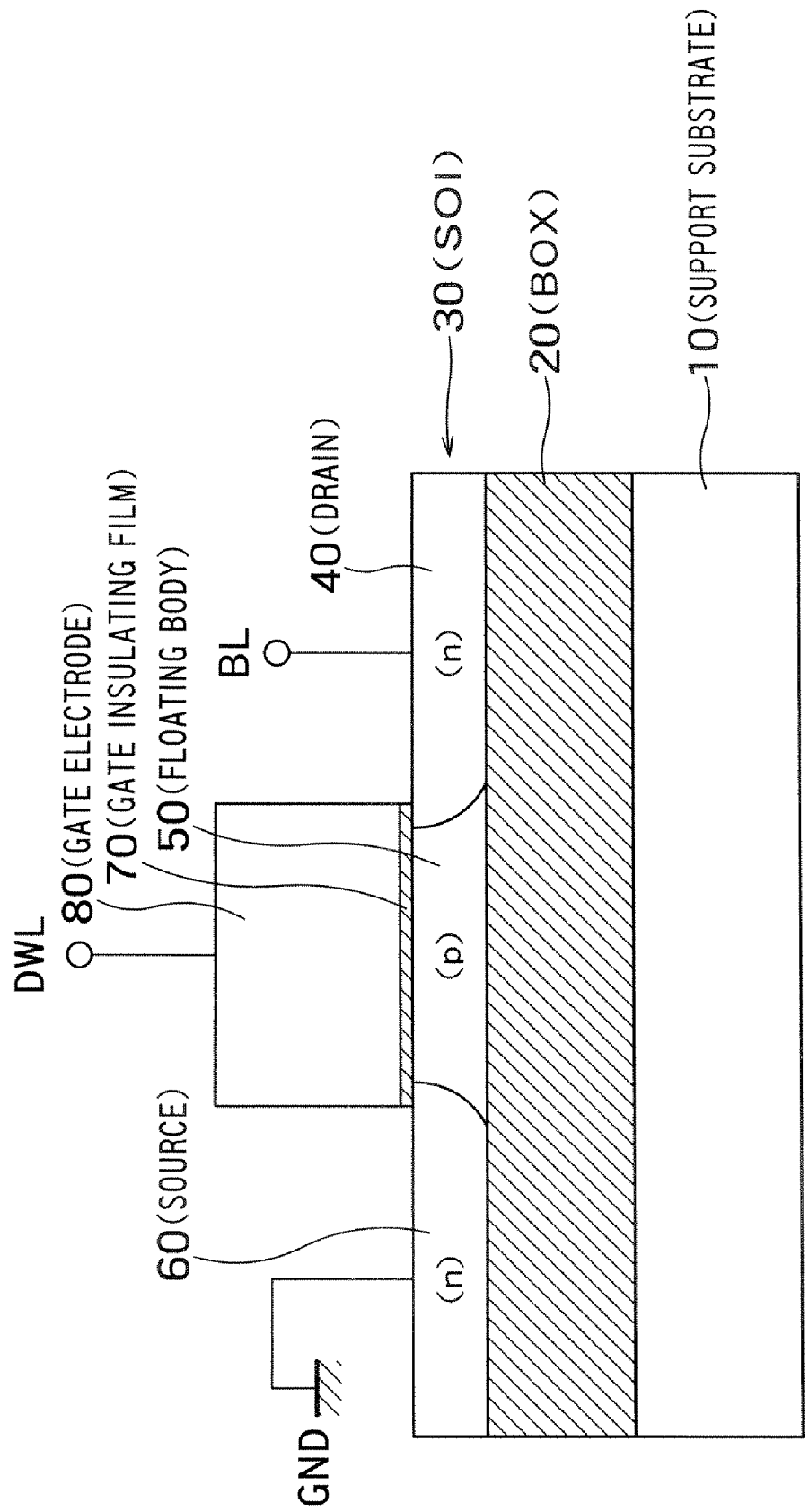
FIG. 2 is a cross section of the structure of each memory cell MC according to the first embodiment.

FIG. 2 is a cross section of the structure of each memory cell MC. The memory cell MC is provided on an SOI substrate including a support substrate 10, a BOX layer 20, and an SOI layer 30. A source 60 and a drain 40 are provided in the SOI layer 30. A floating body 50 is formed in the SOI layer 30 between the source 60 and the drain 40. The floating body 50 is a semiconductor opposite in conductivity type to the source 60 and the drain 40. In the first embodiment, the memory cell MC is an N-type FET. The floating body 50 is in an electrically floating state by being surrounded by the source 60, the drain 40, the BOX layer 20, a gate insulating film 70, and an STI (Shallow Trench Isolation) region (not shown). The FBC memory can store therein data according to the number of majority carriers accumulated in the floating body 50 of each memory cell MC.

It is assumed, for example, that the memory cell MC is an N-type MISFET. It is defined that a state in which a large number of holes are accumulated in the body 50 is a state in which the memory cell MC stores therein the data "1". It is also defined that a state in which a small number of holes are accumulated in the body 50 is a state in which the memory cell MC stores therein the data "0".

To write the data "1" to the memory cell MC, the memory cell MC is operated in a saturation state. For example, the word line WL is biased to 1.5 volts and the bit line BL is biased to 1.5 volts. The voltage of the source is set equal to the ground potential GND (0 volt). By so setting, impact ionization occurs near the drain, thereby generating many pairs of electron and hole. The electrons generated by the impact ionization are carried to the drain, whereas the holes are accumulated in the body having a low potential. When a current applied during generation of the holes by the impact ionization is equal to a forward current at a pn junction between the body and the source, a body voltage reaches to an equilibrium state. The body voltage in the equilibrium state is about 0.7 volt.

To write the data "0" to the memory cell MC, the potential of the bit line BL is reduced to a negative voltage. The potential of the bit line BL is reduced to, for example, −1.5 volts. The pn junction between the body 50 and the drain 40 is greatly biased in a forward direction by the operation of reducing the potential of the bit line BL to the negative voltage. The holes accumulated in the body 50 are emitted to the drain 40, thereby storing the data "0" in the memory cell MC.

In the data read operation, the word line WL is activated similarly to the data write operation but the potential of the bit line BL is set lower than that set during writing of the data "1". For example, the potential of the word line WL is set to 1.5 volts and that of the bit line BL is set to 0.2 volt. The memory cell MC is operated in a linear region. The memory cell MC storing data "0"0 differs in the threshold voltage from the memory cell MC storing data "1" due to the difference in the number of holes accumulated in the body 50. By detecting the difference in the threshold voltage between the memory cells MC, it is discriminated whether the data is "1" or "0". The reason for setting the potential of the bit line BL to the low voltage during the data read operation is as follows. If the voltage of the bit line BL is set high and the memory cell MC is biased to the saturation state, the data "0" is changed to the data "1" by the impact ionization when the data "0" is read from the memory cell MC.

Figure 3:
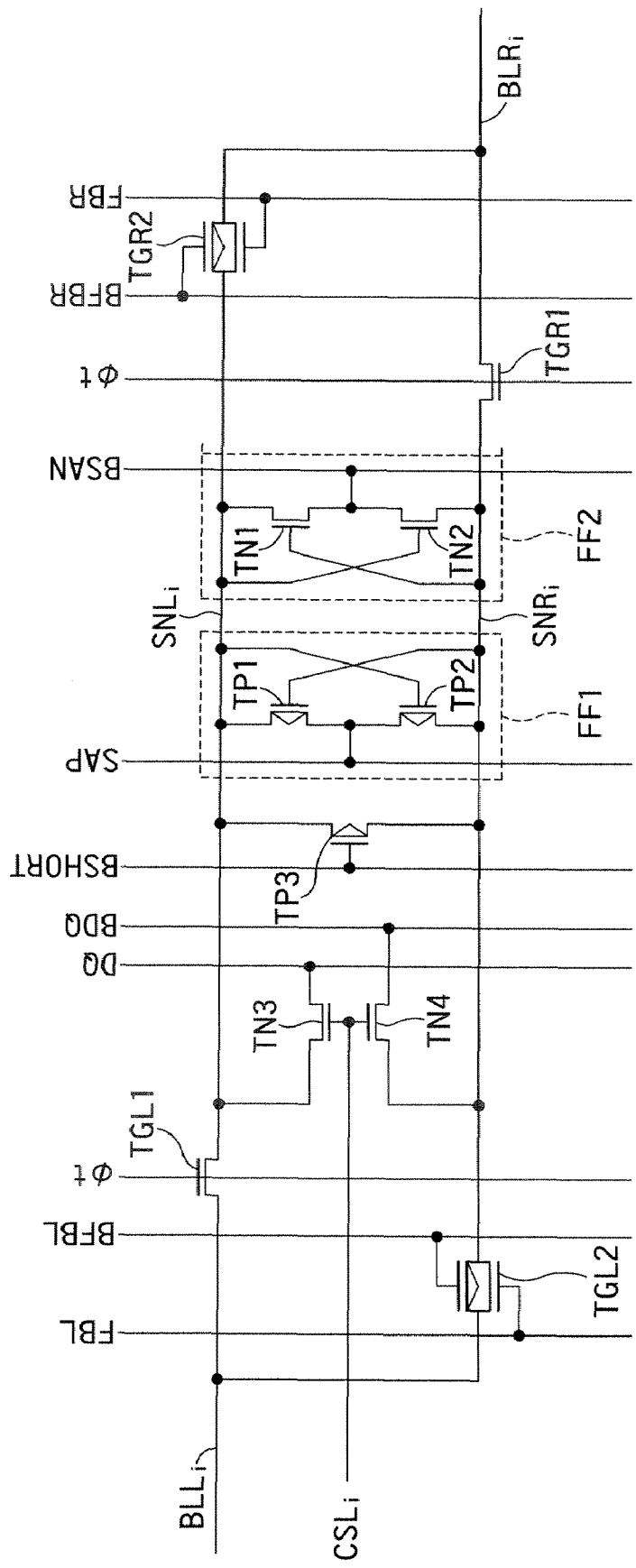
FIG. 3 is a circuit diagram of the configuration of the sense amplifier S/Ai according to the first embodiment.

FIG. 3 is a circuit diagram of the configuration of the sense amplifier S/Ai. The sense amplifier S/Ai is connected to the bit lines BLLi and BLRi provided on the left and right of the sense amplifier S/Ai, respectively, and provided to correspond to the paired bit lines BLLi and BLRi. Thus, an open bit-line configuration is adopted in the first embodiment. Due to this, at the time of the data read operation, one of the paired bit lines BLLi and BLRi transmits the data and the other bit line transmits reference data.

The sense amplifier S/Ai includes a pair of sense nodes SNLi (hereinafter, also "SNL") and SNRi (hereinafter, also "SNR"). For example, the sense node SNLi is a first sense node and the sense node SNRi is a second sense node. The sense node SNL is connected to the bit line BLL through a transfer gate TGL1 serving as a first transfer gate, and to the bit line BLR through a transfer gate TGR2. The sense node SNR is connected to the bit line BLR through the transfer gate TGRL serving as a second transfer gate and to the bit line BLL through a transfer gate TGL2.

The transfer gates TGL1 and TGR1 are controlled to be turned on or off by a signal Φt. The transfer gate TGL2, which is a CMOS transfer gate configured so that a PMOS transistor is connected to an NMOS transistor in parallel, is controlled to be turned on or off by signals FBL and BFBL. The transfer gate TGR2, which is also a CMOS transfer gate, is controlled to be turned on or off by signals FBR and BFBR.

For example, if the data "1" on the bit line BLL is detected, the threshold voltage of the N-type memory cell MC is set low, and the potential of the sense node SNL, therefore, becomes lower than that of the sense node SNR. To write back the data "1" to the memory cell MC, it is necessary to apply a high potential to the bit line BLL. Therefore, by turning on the transfer gate TGL2, the sense node SNR at a high potential is connected to the bit line BLL.

The sense amplifier S/A also includes a cross-coupled dynamic latch circuit (hereinafter, "flip-flop") FF1 and FF2. The flip-flop FF1 includes two p-type transistors TP1 and TP2 connected in series between the sense nodes SNL and SNR. The gate of the transistor TP1 is connected to the sense node SNR, and the gate of the transistor TP2 is connected to the sense node SNL. Namely, the gates of the transistors TN1 and TN2 are cross-coupled with the sense nodes SNR and SNR, respectively. The flip-flop FF2 includes two n-type transistors TN1 and TN2 connected in series between the sense nodes SNL and SNR. The gate of the transistor TN1 is connected to the sense node SNR, and the gate of the transistor TN2 is connected to the sense node SNL. Namely, the gates of the transistors TP1 and TP2 are similarly cross-coupled with the sense nodes SNR and SNL, respectively. The flip-flops FF1 and FF2 are driven by activating signals SAP and BSAN, respectively. The flip-flops FF1 and FF2 amplify and latch the potential difference between the paired sense nodes SNLi and SNRI.

A p-type transistor TP3 serving as a short-circuiting switch is connected between the sense nodes SNL and SNR, and controlled by a signal BSHORT. The transistor TP3 equalizes the potentials of the sense nodes SNL and SNR by short-circuiting the sense nodes SNL and SNR to each other before the read/write operation.

An n-type transistor T1N3 is connected between a DQ line and the sense node SNL, and an n-type transistor TN4 is connected between a BDQ line and the sense node SNR. Gates of the transistors TN3 and TN4 are connected to a column selection line CSLi (hereinafter, also "CSL"). The DQ line and the BDQ line are connected to a DQ buffer (not shown). The DQ buffer temporarily stores therein the data from the memory cell MC to output the data to the outside during the data read operation. Furthermore, the DQ buffer temporarily stores therein the data from the outside to transmit the data to the sense amplifier S/A during the data write operation. Therefore, the column selection line CSL is activated when the data is read or written to or from the outside, thereby making it possible to connect the sense nodes SNL and SNR to the DQ buffer.

It is to be noted that the sense amplifier S/A according to the first embodiment does not include the current-mirror type current load circuit differently from a conventional technique. In the first embodiment, the flip-flop FF1 functions not only as an amplifier circuit including a feedback loop and a latch circuit holding data but also as a current load circuit that applies current to the memory cell. The sense amplifier S/A is provided per pair of bit lines. This means that 1024 sense amplifiers S/A are provided for the two memory cell arrays MCAs. Therefore, if the circuit scale of the sense amplifier S/A is reduced, the chip size of the entire FBC memory device can be greatly reduced.

Hereinafter, "activation" refers to turning on or driving an element or a circuit, and "deactivation" refers to turning off or stopping the element or the circuit. It is, therefore, to be noted that a HIGH (high potential-level) signal sometimes acts as an activation signal and that a LOW (low potential-level) signal sometimes act as an activation signal. An NMOS transistor is activated by setting its gate, for example, HIGH. A PMOS transistor is activated by setting its gate, for example, LOW.

Figure 4:
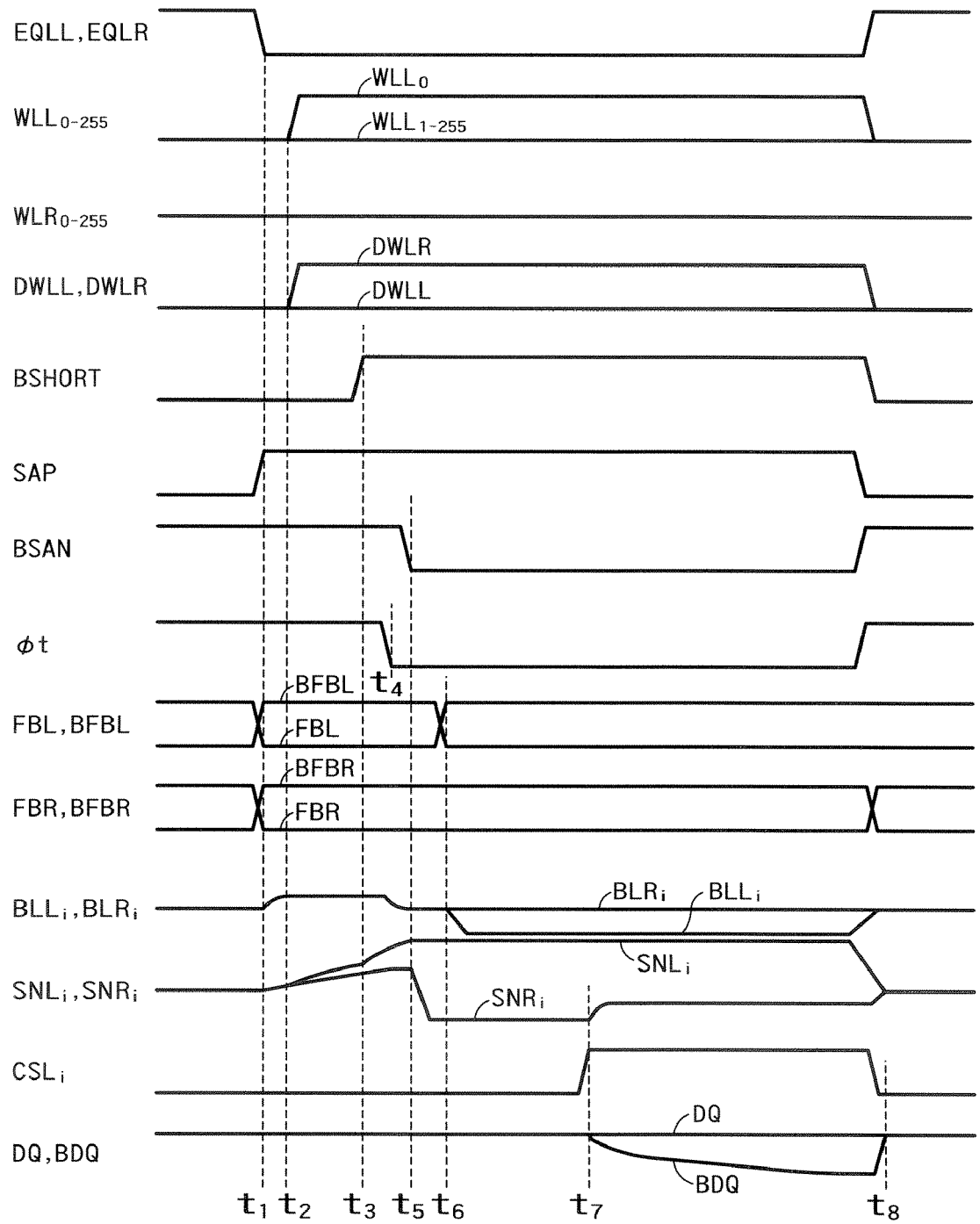
FIG. 4 is a timing chart showing the data read operation performed by the FBC memory device according to the first embodiment.

FIG. 4 is a timing chart showing the data read operation performed by the FBC memory device according to the first embodiment. Before timing t1, the signals EQLL and EQLR are activated to HIGH, whereby the bit lines BL are equalized to the ground potential. Furthermore, the transfer gates TGL1, TGR1, TGL2, and TGR2 are all activated, whereby the sense nodes SNL and SNR are connected to the bit lines BLL and BLR. Accordingly, the bit lines and the sense nodes are precharged to the ground potential.

At the timing t1, the precharging of the bit lines and the sense nodes is finished by deactivating signals EQLL and EQLR to LOW. At the same time, the signal SAP is activated, whereby the transistors TP1 and TP2 that constitute the flip-flop FF1 are turned on. The flip-flop FF1 thereby applies current to the sense nodes SNL and SNR. At this timing, since the signal BSHORT is active (LOW), the sense nodes SNL and SNR are short-circuited. Due to this, the current from the flip-flop FF1 is equally applied to the sense nodes SNL and SNR. As a result, the potential level of the pair of sense nodes SNLi and SNRi rises from the precharge potential level which is equal to the potential of the source of the memory cell.

Furthermore, at the timing t1, the transfer gates TGL2 and TGR2 are turned off. At this timing, the transfer gates TGL1 and TGR1 are kept to be turned on. Due to this, the sense nodes SNLi and SNRi are disconnected from the bit lines BLRi and BLLi while being kept connected to the bit lines BLLi and BLRi, respectively.

At timing t2, one word line and one dummy word line are selected. In the first embodiment, the word line WLL0 in the memory cell array MCAL on the left of the sense amplifiers S/A, and the dummy word line DWLR in the memory cell array MCAR on the right of the sense amplifiers S/A are selected. By activating the selected word line WLL0, the data stored in each of the memory cells MC connected to the selected word line WLL0 is transmitted to the sense node SNLi serving as the first sense node via the bit line BLLi serving as the first bit line. Moreover, by activated the dummy word line DWLR, the reference data is transmitted to the sense node SNRi serving as the second sense node via the bit line BLRi serving as the second bit line.

During timings t1 to t3, the data stored in each memory cell MC is transmitted to the sense node SNLi and the reference data is transmitted to the sense node SNRi. However, since the sense nodes SNLi and SNRi are short-circuited, the sense nodes SNLi and SNRi are almost equal in potential. It is to be noted, however, that, the potential difference is generated between the sense nodes SNLi and SNRi to some extent due to the data stored in the memory cell MC during timings t2 to t3, because the transistor TP3 includes a parasitic resistance even if the transistor TP3 is turned on.

After generation of the potential difference between the paired sense nodes SNLi and SNRi to some extent, the signal BSHORT is deactivated to HIGH at the timing t3. The transistor TP3 is thereby turned off and the sense node SNLi is disconnected from the sense node SNRi. At the timing t3, when the sense node SNLi is disconnected from the sense node SNRi, a potential difference is rapidly generated between the sense nodes SNLi and SNRi due to the difference between the current flowing to the memory cell MC and the current flowing to the reference transistor TREF. Since the feedback loop constituted by the PMOS transistors TP1 and TP2 is formed in the flip-flop FF1, the flip-flop FF1 amplifies the potential difference quite promptly.

Ideally, the sense nodes SNLi and SNRi are symmetric. However, in actual practice, due to manufacturing irregularity, the sense nodes SNLi and SNRi are not completely symmetric. For example, the threshold voltage of the transfer gate TGL1 possibly differs from that of the transfer gate TGRI. If the short-circuit between the sense nodes SNLi and SNRi is disconnected at the timing t1, the flip-flop FF1 possibly detects the potential difference generated by the difference in characteristics between the transfer gates TGL1 and TGR1.

In the first embodiment, therefore, the paired sense nodes SNLi and SNRi is kept short-circuited until the potential difference is amplified to some extent between the paired sense nodes SNLi and SNRi, thereby suppressing the loop gain of the flip-flop FF1 to be low. The sense amplifier S/A can thereby accurately amplify data. Furthermore, the sense node SNLi is disconnected from the sense node SNRi after amplification of the potential difference to some extent between the paired sense nodes SNLi and SNRi. The sense amplifier S/A can thereby detect the potential difference between the sense nodes SNLi and SNRi at a high speed.

If the size (W/L) of the transistor TP3 serving as the short-circuiting switch is reduced, the parasitic resistance of the transistor TP3 is increased. As a result, during the timings t1 to t3, the potential difference between the sense nodes SNLi and SNRi is promptly increased. It is, therefore, preferable to reduce the size (W/L) of the transistor TP3 so as to make the timing of turning off the transistor TP3 closer to the timing t1 and to accelerate the data read speed. However, if the size (W/L) of the transistor TP3 is excessively small, the loop gain of the flip-flop FF1 at the timings t2 to t3 becomes excessively large and malfunction possibly occurs. Accordingly, it is necessary to optimally set the size (W/L) of the transistor TP3.

In the first embodiment, the timing of turning off the transistor TP3 can be made equal to the timing t2. This is achieved when the manufacturing process is managed so that the irregularity among elements such as the transistors constituting the sense amplifier circuit S/A is smaller than the signal amount of the memory cell. Furthermore, if the manufacturing irregularity among the elements can be suppressed sufficiently small and if the signal amount of the memory cell MC can be secured sufficiently large, the timing t1 of activating the signal SAP, the timing t2 of activating the word line WL, and the timing t3 of disactivating the signal BSHORT can be made all equal. By setting the timings t1, t2, t3 equal (t1=t2=t3), the operating rate of the sense amplifier circuit SA can be further accelerated. Moreover, by reducing the manufacturing irregularity and increasing the signal amount, the sense amplifier S/A can accurately amplify data without dependence on the order of t1, t2, and t3.

At timing t4, the signal Φt is deactivated. The transfer gates TGL1 and TGR1 are thereby turned off, and the paired sense nodes SNLi and SNRi are disconnected from the paired bit lines BLLi and BLRi.

At timing t5, the signal BSAN is activated to LOW. The flip-flop FF2 thereby further detects the potential difference between the sense nodes SNLi and SNRi. The flip-flops FF1 and FF2 store the detected data in the sense nodes SNLi and SNRi.

At timing t6, the transfer gate TGL2 serving as the first transfer gate and the transfer gate TGR2 serving as the second transfer gate are activated, and the sense node SNRi is connected to the bit line BLLi. The read data is thereby written back to the memory cell MC.

At timing t7, the column selection line CSLi is activated. The sense nodes SNLi and SNRi corresponding to a selected column are thereby connected to the DQ line and the BDQ line, respectively. The DQ line and the BDQ line are connected to a DQ buffer (not shown). Data is temporarily stored in the DQ buffer and then output to the outside from the DQ buffer.

Finally, at timing t8, the signals EQLL and EQLR are activated, thereby making the sense amplifier S/A become a precharged state.

Figure 5:
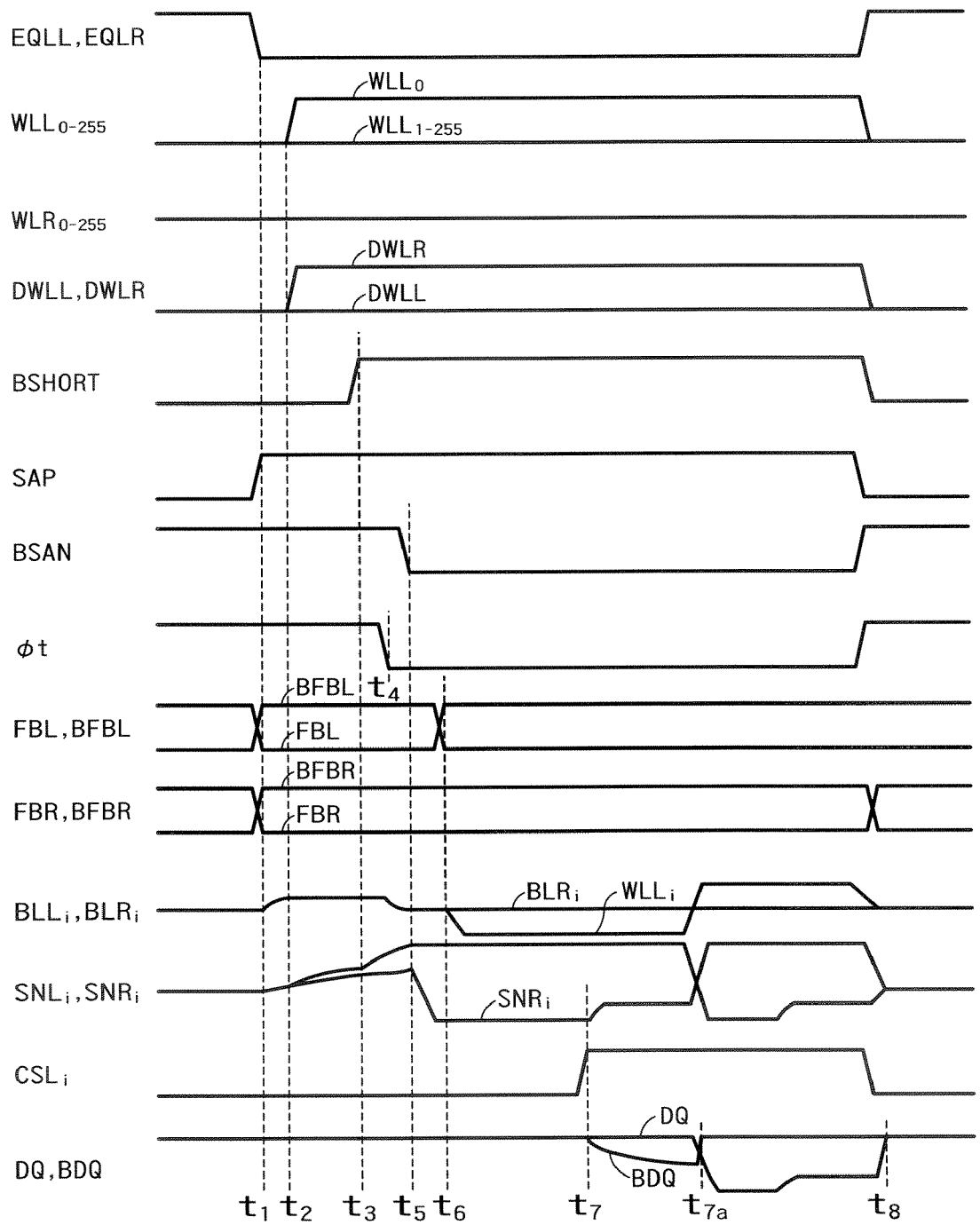
FIG. 5 is a timing chart showing the data write operation performed by the FBC memory device according to the first embodiment.

FIG. 5 is a timing chart showing the data write operation performed by the FBC memory device according to the first embodiment. Since the data write operation during the timings t1 to t7 is the same as the data read operation during the timings t1 to t7 shown in FIG. 4, it will not be explained herein. In the data write operation, the data input from the outside is temporarily stored in the DQ buffer. During timings t7a to t8, the temporarily-stored data is written to the memory cell MC through the sense nodes and the bit lines.

In the first embodiment, the flip-flop FF1 is employed not only as the flip-flop but also as the current load circuit. It is, therefore, possible to dispense with the current load circuit that is required in the conventional technique. The circuit scale of the sense amplifier S/A and the chip size of the entire FBC memory device can be thereby reduced.

In the first embodiment, the data read speed can be accelerated by adjusting the size of each of the circuit elements that constitute the sense amplifier S/A. According to the conventional technique, the data read speed is set according to the characteristic irregularity among the circuit elements constituting the sense amplifier S/A. In the first embodiment, the data read speed still depends on the characteristic irregularity among the circuit elements constituting the sense amplifier S/A. However, it is possible to reduce the degree of dependence of the data read speed on the characteristic irregularity among the circuit elements by changing the size (W/L) of the short-circuiting transistor (TP3).

A Modification of the First Embodiment

Figure 6:
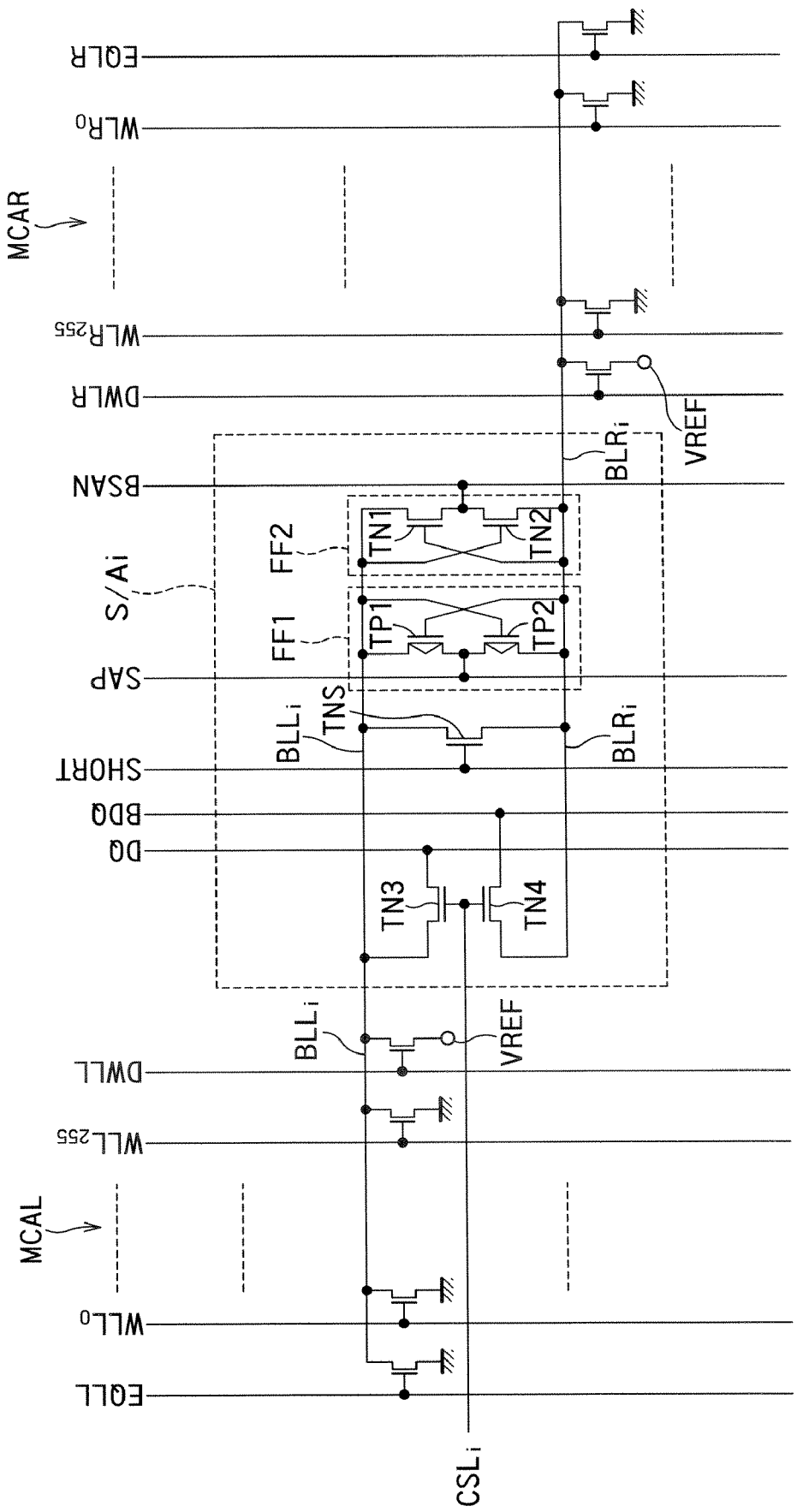
FIG. 6 is a circuit diagram of a sense amplifier S/A according to a modification of the first embodiment.
Figure 7:
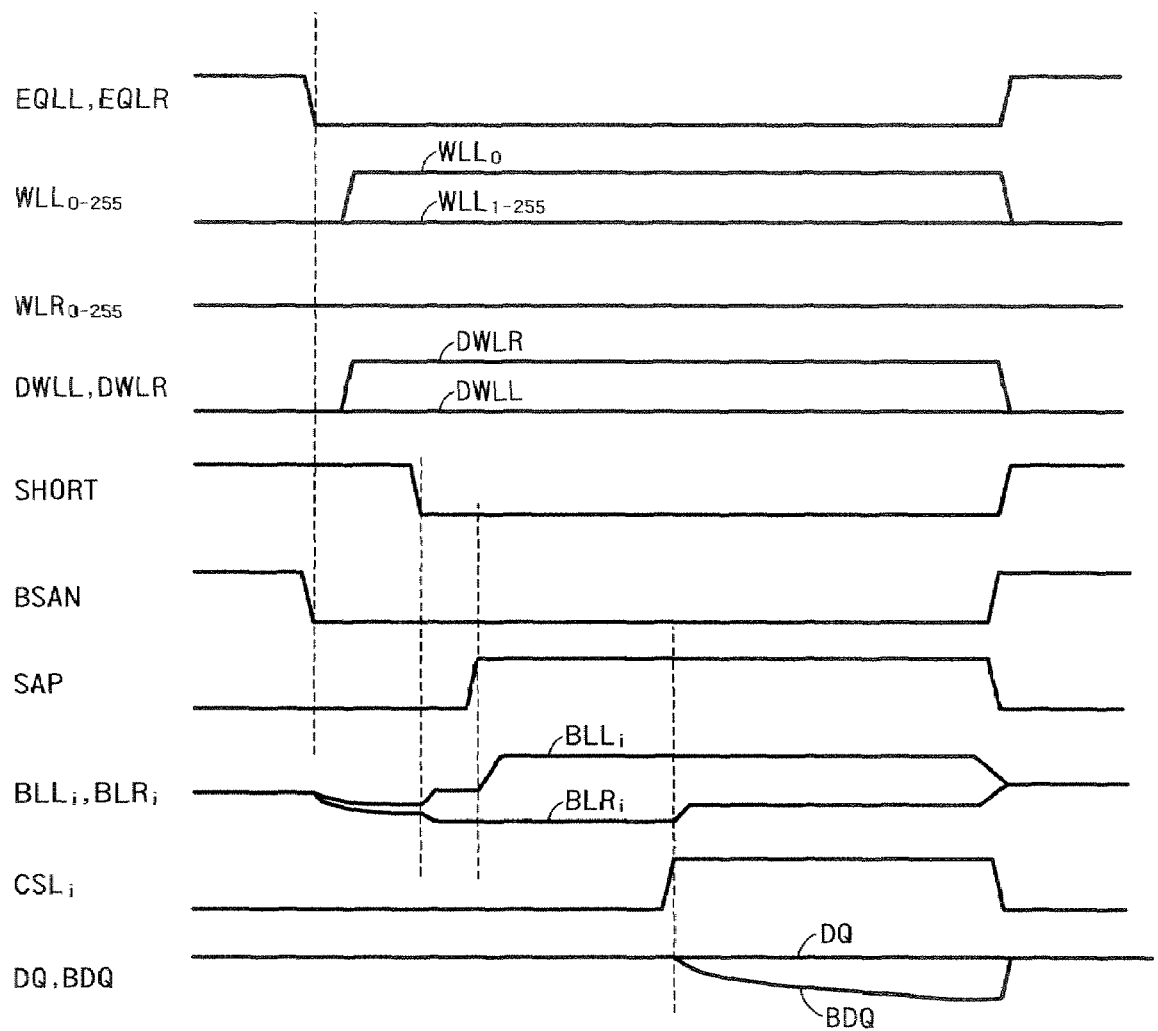
FIG. 7 shows a timing chart of an operation of a sense amplifier S/A according to a modification of the first embodiment.

FIG. 6 is a circuit diagram of a sense amplifier S/A according to a modification of the first embodiment. And FIG. 7 shows a timing chart of its operation. As shown in this modification, it is possible to connect a sense amplifier S/A directly to a pair of bit lines and to amplify the signal on the bit lines. That is, the sense amplifier S/A does not have sense nodes SNL, SNR and the transfer gates TGL1, TGL2, TGRL and TGR2. The other structures of the modification are same as the structure of the first embodiment.

As shown in FIG. 7, the flip-flop FF1 in this modification amplifies data in a situation that the short-circuiting switch TNS short-circuits the bit line BLL to the bit line BLR. Then, the short-circuiting switch TNS disconnects the bit line BLL from the bit line BLR after or simultaneously with amplification of the data. This operation is same as the operation of the first embodiment.

As a result, this modification can obtain the same advantages of the first embodiment described above.

SECOND EMBODIMENT

Figure 8:
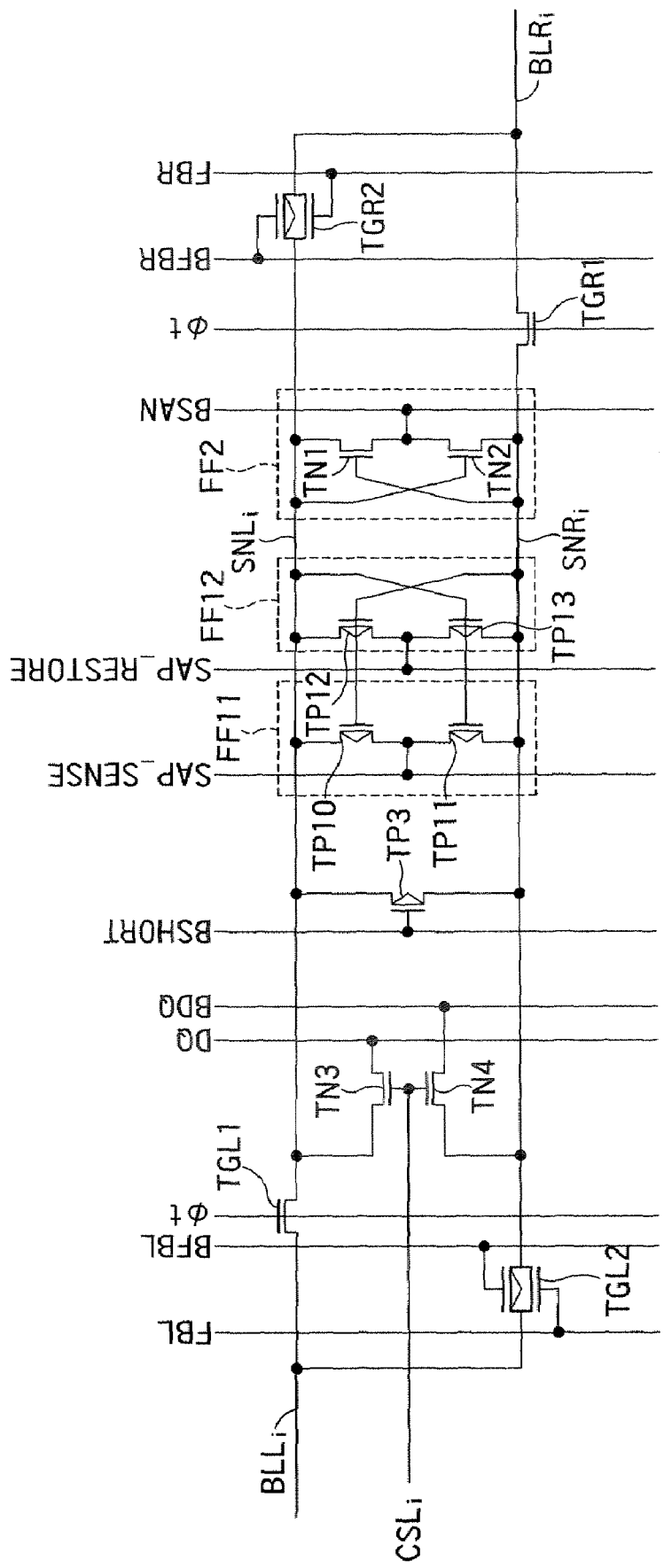
FIG. 8 is a circuit diagram of a sense amplifier S/A according to a second embodiment of the present invention.

FIG. 8 is a circuit diagram of a sense amplifier S/A according to a second embodiment of the present invention. The sense amplifier S/A according to the second embodiment differs from that according to the first embodiment in that the sense amplifier S/A includes a first flip-flop FF11 constituted by PMOS transistors TP10 and TP11 and a second flip-flop FF12 constituted by PMOS transistors TP12 and TP13 instead of the flip-flops FF1. The other configurations of the sense amplifier S/A according to the second embodiment can be the same as those according to the first embodiment.

The transistors TP10 and TP11 are connected in series between the sense nodes SNL and SNR. The transistors TP12 and TP13 are connected in series between the sense nodes SNL and SNR. Gates of the transistors TP10 and TP12 are connected in common to the sense node SNR. Gates of the transistors TP11 and TP13 are connected in common to the sense node SNL. Namely, the gates of the transistors TP10 and TP12 and those of the transistors TP11 and TP13 are cross-coupled with the sense nodes SNL and SNR.

A signal SAP_SENSE is input to the node between the transistors TP10 and TP11. A signal SAP_RESTORE is input to the node between the transistors TP12 and TP13.

Generally, if the size (W/L) of a transistor is larger, the current driving capability of the transistor is higher. However, if the size (W/L) of the transistor is larger than the size (W/L) of the transistor which constitutes the memory cell, the influence of irregularity in a threshold voltage increases. Due to this, if the size (W/L) of each of the PMOS transistors which constitute the flip-flop FF11 is increased, the current driving capability of the PMOS transistor is enhanced during the data write operation. At the same time, however, there is a probability of misdetection of data during the data read operation.

In the second embodiment, therefore, only the transistors TP10 and TP11 of the transistors TP10 to TP13 are used during data amplification and detection, and all of the transistors TP10 to TP13 are used during the data write operation. By doing so, during the data amplification and detection, it is possible to prevent misdetection of data by suppressing loop gains of the flip-flops to be low. During the data write operation, it is possible to ensure writing back the data to the memory cell MC by enhancing the current driving capabilities of the flip-flops. It is to be noted that the transistors TP10 and TP11 are designed to be equal in size, and that the transistors TP12 and TP13 are designed to be equal in size. Furthermore, the transistors TP10 and TP11 can be either the same or different in size as or from the transistors TP12 and TP13. To improve the effects of preventing the data misdetection and enhancing the current driving capability, it is preferable that the size (W/L) of the transistors TP10 and TP11 is smaller than that of the transistors TP12 and TP13.

Figure 9:
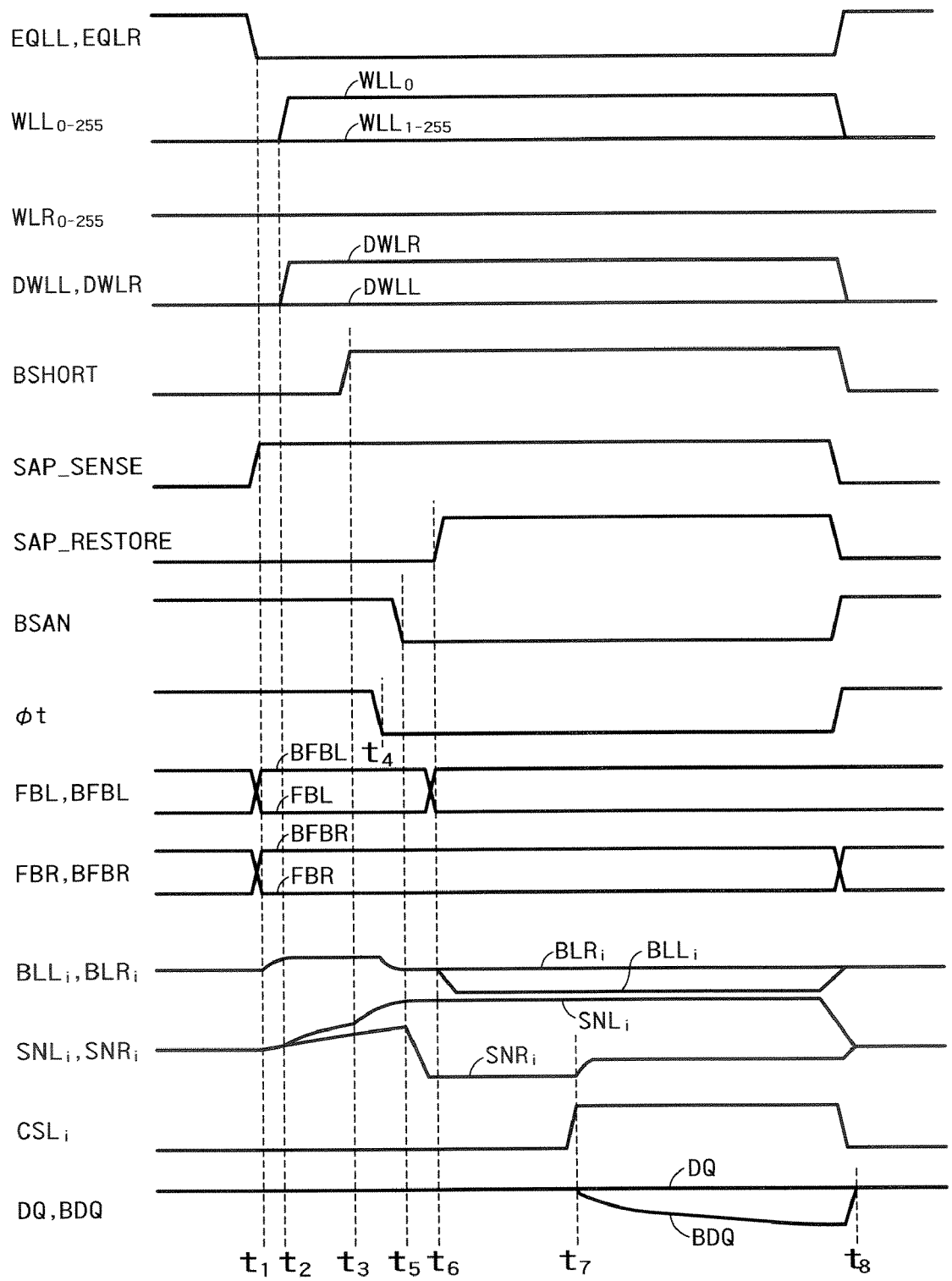
FIG. 9 is a timing chart showing the data read operation performed by the FBC memory device according to the second embodiment.

FIG. 9 is a timing chart showing the data read operation performed by the FBC memory device according to the second embodiment. The signal SAP_SENSE operates similarly to the signal SAP shown in FIG. 4. Accordingly, the transistors TP10 and TP11 operate similarly to the transistors TP1 and TP2 shown in FIG. 3. Namely, a latch circuit constituted by the transistors TP10 and TP11 is used for both the data read operation and the data write operation.

The signal SAP_RESTORE is activated at timing t6, so that the transistors TP12 and TP13 operate at the timing t6. As a result, during the data read operation, the transistors TP10 and TP11 can accurately amplify and detect data. During the data write operation, all of the transistors TP10 to TP13 can write data to the memory cell MC with their high current driving capabilities. Further, the second embodiment exhibits the same advantages as those of the first embodiment.

It is to be noted that a timing chart showing the data write operation is the same as the timing chart shown in FIG. 5 except that the signal SAP shown in FIG. 5 is replaced by the signals SAP_SENSE and SAP_RESTORE shown in FIG. 9. Since the data write operation can be easily analogized from FIGS. 5 and 7, it will not be explained herein.

In the second embodiment, if the manufacturing process is managed so that irregularities among the transistors constituting the sense amplifier S/A are sufficiently small, the order of timings t1, t2, and t3 can be set as desired similarly to the first embodiment. Needless to say, the timings t1, t2, and t3 can be set equal, i.e., t1=t2=t3.

THIRD EMBODIMENT

Figure 10:
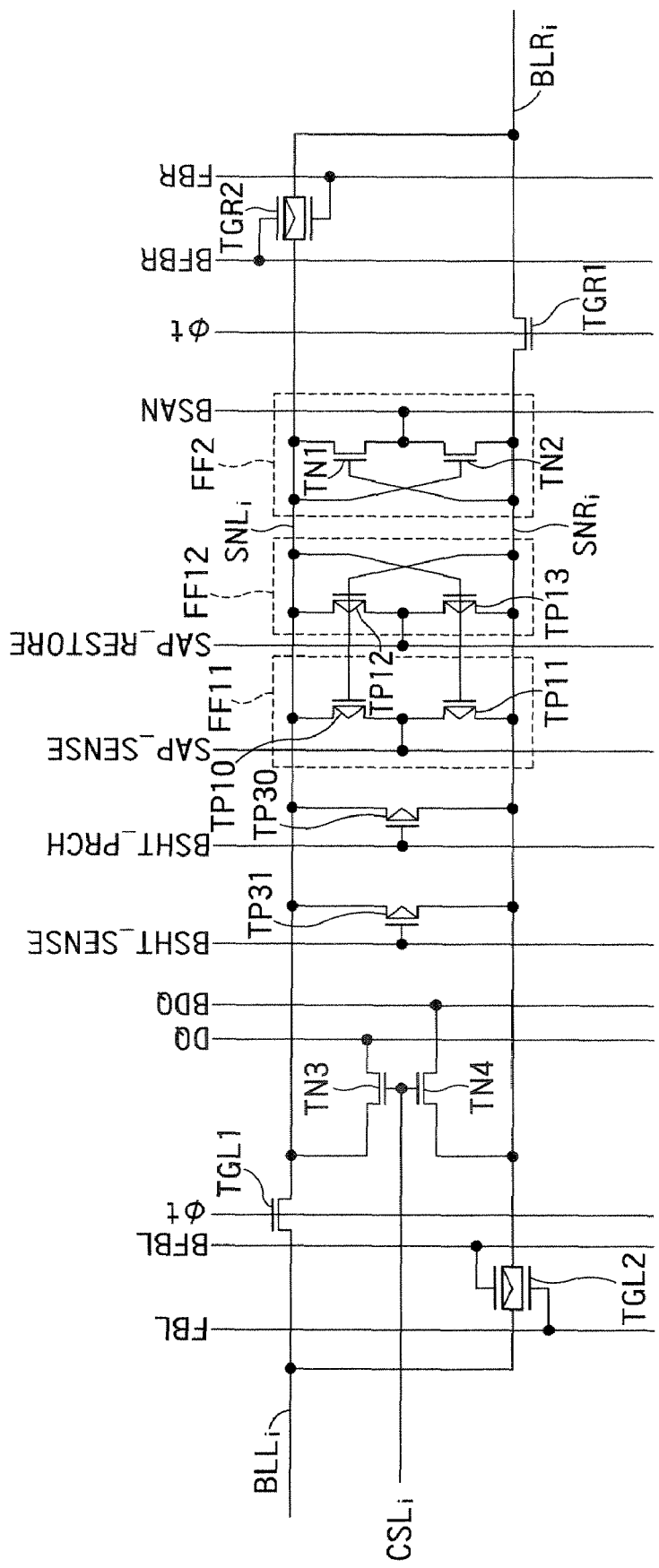
FIG. 10 is a circuit diagram of a sense amplifier S/A according to a third embodiment of the present invention.

FIG. 10 is a circuit diagram of a sense amplifier S/A according to a third embodiment of the present invention. The sense amplifier S/A according to the third embodiment differs from that according to the second embodiment in that the sense amplifier S/A according to the third embodiment includes a PMOS transistor TP30 serving as a first short-circuiting switch and a PMOS transistor TP31 serving as a second short-circuiting switch in place of the PMOS transistor TP3 shown in FIG. 8. The other configurations of the sense amplifier S/A according to the third embodiment can be the same as those according to the second embodiment. The sum of sizes (W/L) of the transistors TP30 and TP31 can be set almost equal to the size (W/L) of the transistor TP3 according to the first and the second embodiments. The size (W/L) of the transistor TP30 needs to be sufficiently large to quickly equalize the paired sense nodes during precharging (before t1 and after t8). However, the size (W/L) of the transistor TP31 should not be made too large since it suffices to secure the loop gain of the flip-flop FF11 to some extent. Although the specific sizes of the transistors TP30 and TP31 depend on specifications, the transistor TP31 is preferably smaller in size than the transistor TP30.

The transistors TP30 and TP31 are connected between the sense nodes SNL and SNR. A signal BSHT_PRCH is input to the gate of the transistor TP30, and a signal BSHT_SENSE is input to the gate of the transistor TP31.

Figure 11:
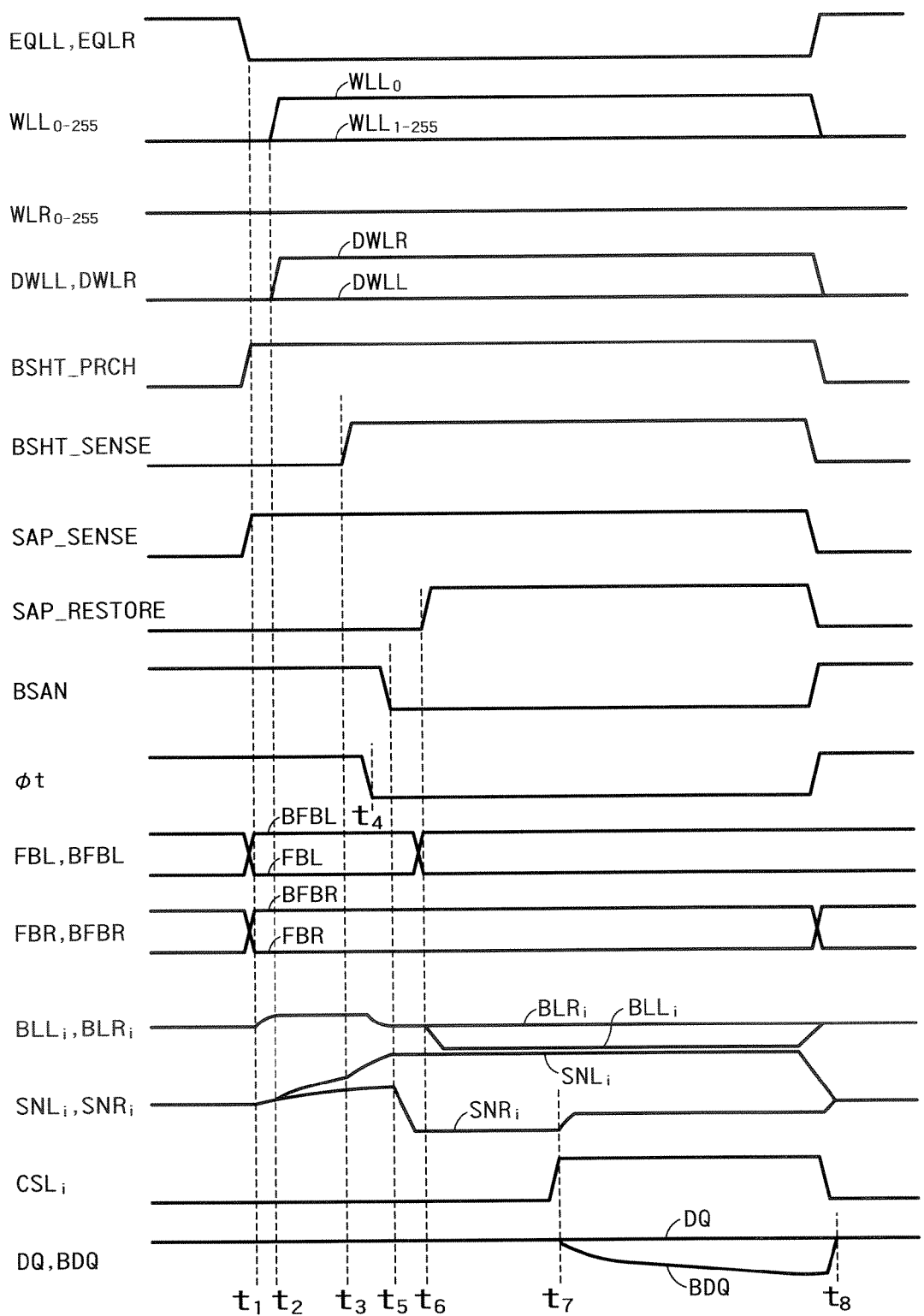
FIG. 11 is a timing chart showing the data read operation performed by the FBC memory device according to the third embodiment.

FIG. 11 is a timing chart showing the data read operation performed by the FBC memory device according to the third embodiment. Before timing t1, the transistors TP30 and TP31 are both turned on, thereby short-circuiting between the sense nodes SNLi and SNRi. At the timing t1, the signal BSHT_PRCH is HIGH. Therefore, similarly to the transistor TP3 shown in FIG. 8, the transistor TP30 disconnects the sense nodes SNLi and SNRi from each other when the flip-flop FF11 detects data. The flip-flop FF11 thereby detects the potential difference generated between the sense nodes SNLi and SNRi. On the other hand, the transistor TP31 is turned on during timings t1 to t3. After the flip-flop FF11 amplifies data to some extent, the transistor TP31 disconnects the sense nodes SNLi and SNRi from each other at the timing t3. Namely, the transistors TP30 and TP31 disconnect the sense nodes SNLi and SNRi from each other stepwise.

As described above, it is necessary to suppress the loop gains of the flip-flops FF11 and FF12 to be low until the potential difference between the paired sense nodes SNLi and SNRi generated by the data stored in the memory cell MC exceeds the irregularity caused by asymmetry of the sense amplifier. In the second embodiment, to suppress the loop gains of the flip-flops FF11 and FF12 to be low during the data read operation, the transistors TP10 and TP11 are operated without causing the flip-flop FF12 to operate during the timings t1 to t6.

In the third embodiment, in order to further suppress the loop gains of the flip-flops to be low during the data read operation, the transistor TP30 serving as the first short-circuiting transistor is turned off during the timings t1 to t3 of the data read operation, while the transistor TP31 serving as the second short-circuiting transistor maintains on-state. The sense nodes SNLi and SNRi are thereby short-circuited weakly in a relatively high resistance state without completely disconnecting the sense nodes SNLi and SNRi. In the third embodiment, the loop gain of the flip-flop FF11 can be reduced greatly during the data read operation, as compared with the second embodiment. Moreover, the third embodiment can exhibit the same advantages as those of the second embodiment.

In the third embodiment, the short-circuiting transistor TP3 according to the second embodiment is divided into the two short-circuiting transistors. Alternatively, in the third embodiment, the short-circuiting transistor according to the first embodiment can be divided into the two short-circuiting transistors. In the alternative, the third embodiment can also exhibit the same advantages as those of the first embodiment.

It is to be noted that a timing chart showing the data write operation is the same as the timing chart shown in FIG. 5 except for the following respects. The signal SAP shown in FIG. 5 is replaced by the signals SAP_SENSE and SAP_RESTORE shown in FIG. 9. Furthermore, the signal BSHORT shown in FIG. 5 is replaced by the signals BSHT_PRCH and BSHT_SENSE in FIG. 11. Since the data write operation can be easily analogized from FIGS. 5, 7, and 9, it will not be explained herein.

FOURTH EMBODIMENT

Figure 12:
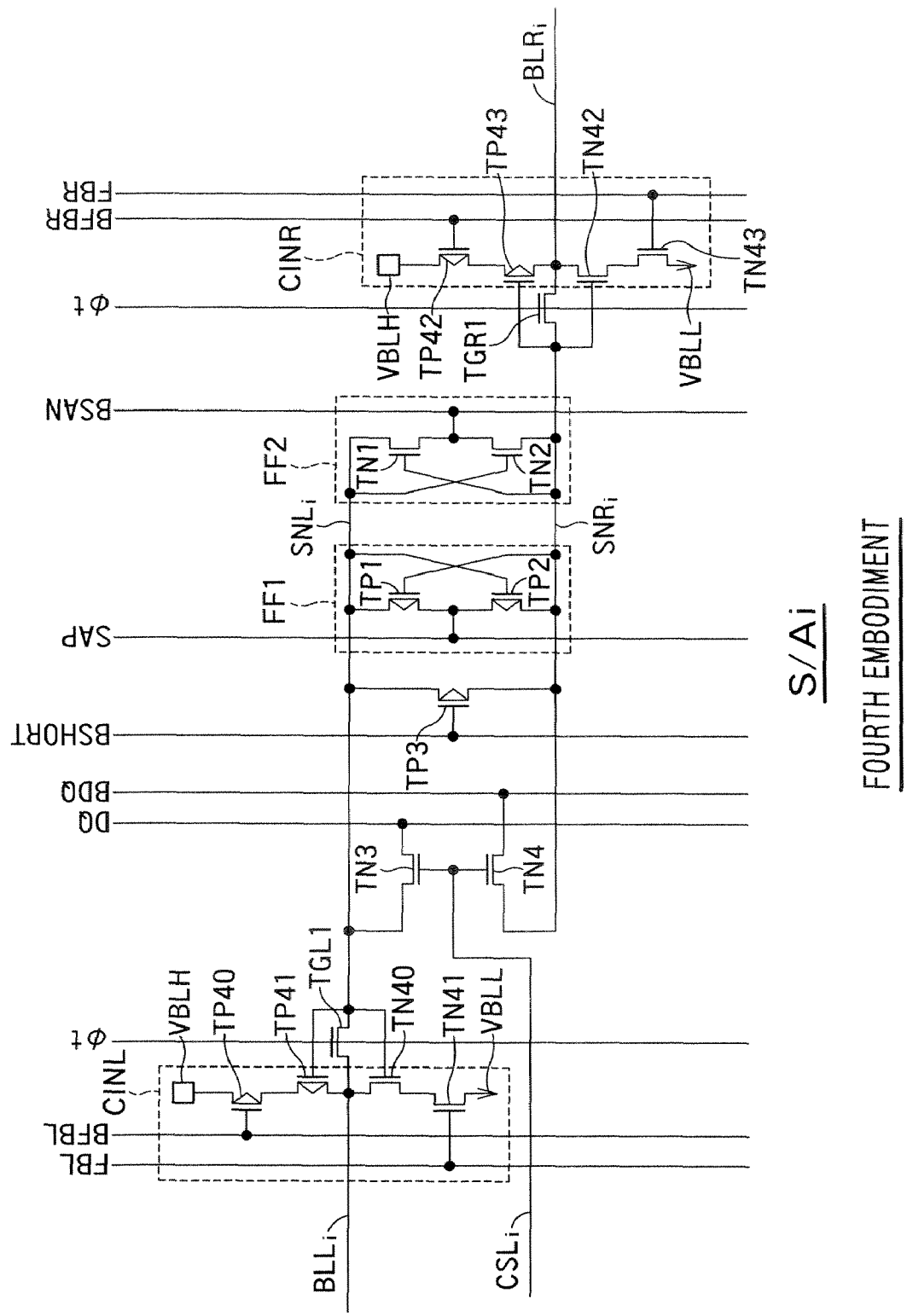
FIG. 12 is a circuit diagram of a sense amplifier S/A according to a fourth embodiment of the present invention.

FIG. 12 is a circuit diagram of a sense amplifier S/A according to a fourth embodiment of the present invention. The sense amplifier S/A according to the fourth embodiment differs from that shown in FIG. 3 in that the sense amplifier S/A according to the fourth embodiment does not include the transfer gate TGR2 connecting the first sense node SNLi to the second bit line BLRi and the transfer gate TGL2 connecting the second sense node SNRi to the first bit line BLLi. Furthermore, the sense amplifier S/A according to the fourth embodiment includes a first clocked inverter CINL and a second clocked inverter CINR. The first clocked inverter CINL is connected in parallel to the first transfer gate TGL1 between the first bit line BLLi and the first sense node SNLi. The second clocked inverter CINR is connected in parallel to the second transfer gate TGR1 between the second bit line BLRi and the second sense node SNRi. The other configurations of the sense amplifier S/A according to the fourth embodiment can be the same as those according to the first embodiment.

The first clocked inverter CINL includes PMOS transistors TP40 and TP41 and NMOS transistors TN40 and TN41 serially connected between a power supply VBLH for writing the data "1" and a power supply VBLL for writing the data "0." Gates of the transistors TP41 and TN40 are connected in common to the sense node SNLi. Signals BFBL and FBL are input to gates of the transistors TP40 and TN41, respectively. The node between the transistors TP41 and TN40 is connected to the bit line BLLi.

The second clocked inverter CINR includes PMOS transistors TP42 and TP43 and NMOS transistors TN42 and TN43 serially connected between the power supply VBLH and the power supply VBLL. Gates of the transistors TP43 and TN42 are connected in common to the sense node SNRi. The signals BFBR and FBR are input to gates of the transistors TP42 and TN43, respectively. The node between the transistors TP43 and TN42 is connected to the bit line BLRi.

The data read operation and the data write operation performed by the FBC memory device according to the fourth embodiment are substantially the same as those according to the first embodiment shown in FIGS. 4 and 5, respectively. However, in the fourth embodiment, differently from the first embodiment, data is written back to the memory cell MC not using the potential difference between the paired sense nodes SNLi and SNRi but using the clocked inverters CINL and CINR. Therefore, the signals FBL and BFBL operate similarly to the signals FBL and BFBL according to the first embodiment. However, the signals FBL and BFBL control the clocked inverters CINL and CINR, but not the CMOS transfer gates TGL2 and TGR2.

The flip-flops FF1 and FF2 are used solely for the data read operation. When the data is written back to the memory cell MC, the flip-flops FF1 and FF2 are used for just switching the transistors TP41, TN40, TP43, and TN42 and not directly used for writing the data. Due to this, sizes of the transistors TP1, TP2, TN1, and TN2 within the flip-flops FF1 and FF2 can be set small, as compared with the first to the third embodiments. As a result, the sizes of the transistors TP1, TP2, TN1, and TN2 can be set to be adapted to the loop gains of the flip-flops FF1 and FF2 which are necessary during the data read operation As compared with the sense amplifier S/A according to the first embodiment, about four more transistors are included in the sense amplifier S/A according to the fourth embodiment. However, since the respective sizes of the transistors TP1, TP2, TN1, and TN2 can be set smaller, an entire chip area is not so increased but can be made almost equal to that according to the first embodiment.

The fourth embodiment can be combined with the second or third embodiment. In this case, the fourth embodiment can exhibit the same advantages as those of the second or the third embodiment.

In the fourth embodiment, if the manufacturing process is managed so that irregularities among the transistors constituting the sense amplifier S/A are sufficiently small, the order of timings t1, t2, and t3 can be set as desired similarly to the first embodiment. Needless to say, the timings t1, t2, and t3 can be set equal, i.e., t1=t2=t3.

FIFTH EMBODIMENT

Figure 13:
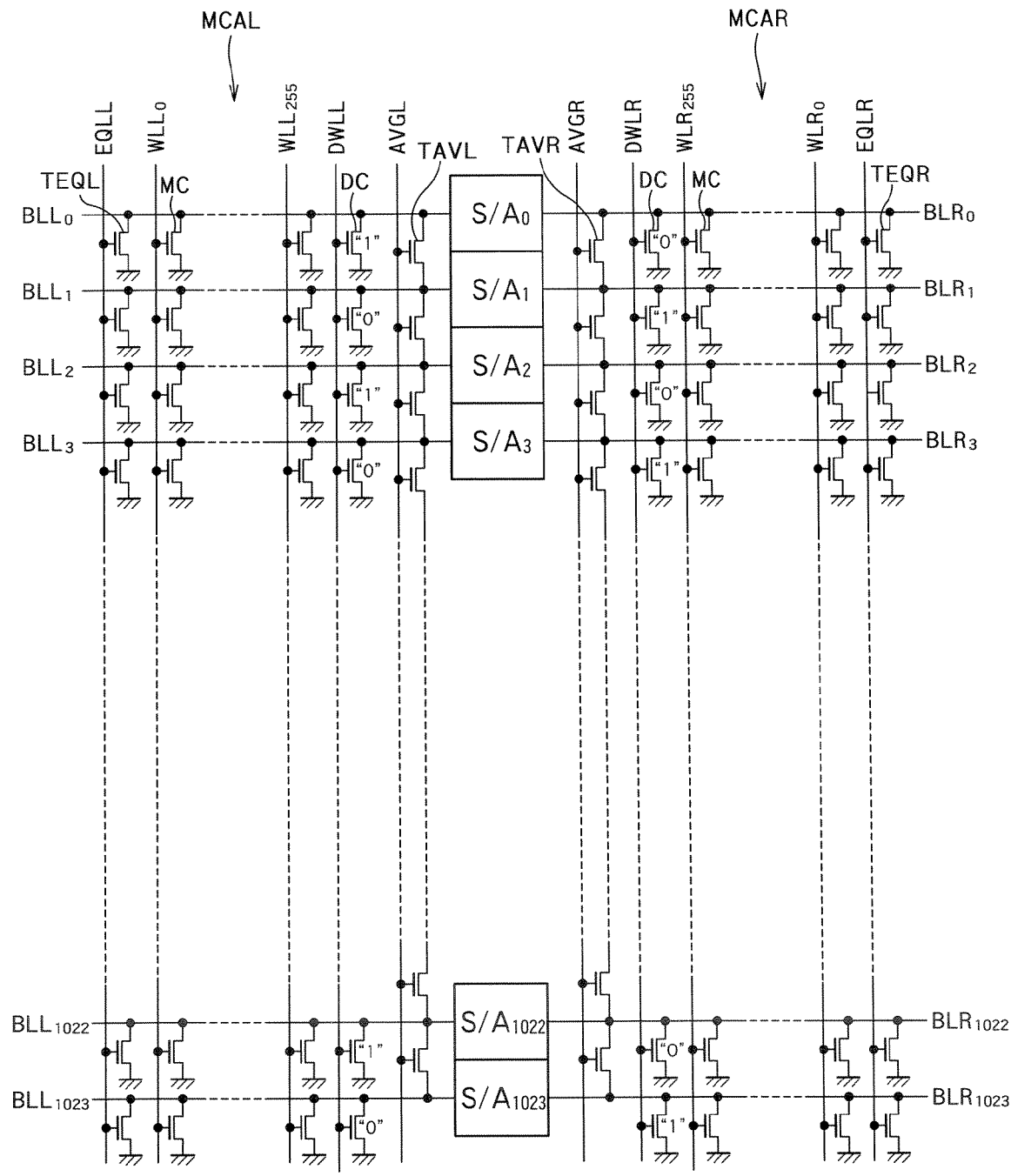
FIG. 13 is a circuit diagram of an FBC memory device according to a fifth embodiment of the present invention.

FIG. 13 is a circuit diagram of an FBC memory device according to a fifth embodiment of the present invention. The FBC memory device according to the fifth embodiment includes dummy cells DC, dummy word lines DWLL and DWLR, averaging transistors TAVL and TAVR, and averaging signal lines AVGL and AVGR. The dummy word lines DWLL and DWLR extend almost in parallel to the word lines WLL and WLR in the row direction, and are connected to the gate of each dummy cell DC. The dummy cells DC alternately store therein data "1" and "0" along the dummy word lines DWLL and DWLR, respectively.

Figure 14:
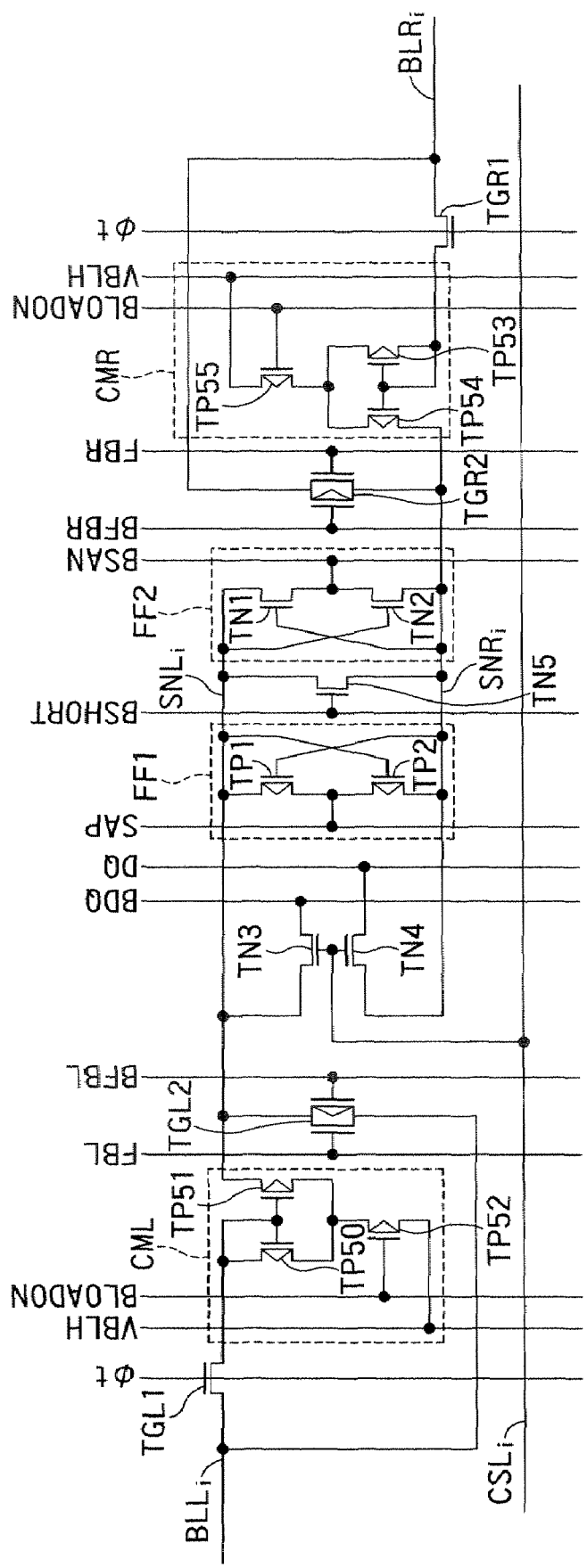
FIG. 14 is a circuit diagram of the sense amplifier S/Ai according to the fifth embodiment.

In the data read operation, one of the memory cell arrays MCAL and MCAR transmits data to the sense amplifiers S/A, whereas the other one generates the reference potential. If the bit line BLRi generates a reference potential, for example, then the dummy word line DWLR is activated and none of the word lines WLR are activated Furthermore, the averaging transistor TAVR short-circuits all of the bit lines BLR by activating the averaging signal line AVGR. The dummy cells DC storing therein the data "0" are thus connected to the dummy cells DC storing therein the data "1", thereby generating an intermediate potential between the data "0" and the data "1". Such a method of generating the reference potential by short-circuiting the dummy cells DC storing therein the data "0" to the dummy cells DC storing therein the data "1" will be referred to as a "dummy cell method" hereinafter FIG. 14 is a circuit diagram of the sense amplifier S/Ai according to the fifth embodiment. In the fifth embodiment, the sense amplifier S/Ai includes current mirrors CML and CMR. The current mirrors CML and CMR are provided between the bit line BLLi and the sense node SNLi and between the bit line BLRi and the sense node SNRi, respectively to ensure the stability of the reference potential. The bit lines BLLi and BLRi are separated from the sense nodes SNLi and SNRi by the current mirrors CML and CMR.

The current mirror CML includes PMOS transistors TP50 to TP52. The transistor TP52 is controlled by a signal BLOADON and functions as a switch of the current mirror CML, Gates of the transistors TP50 and TP51 are connected in common to the bit line BLLi. The transistors TP50 and TP51, which are almost equal in size (W/L), supply equal current from the power supply VBLH to the bit line BLLi and the sense node SNLi. Alternatively, the transistor TP51 can be made larger in size than the transistor TP50 to amplify the current to be supplied to the memory cell MC via the sense nodes SNLi and SNRi. The sensing speed of the sense amplifier S/A can be thereby accelerated. The current mirror CMR includes PMOS transistors TP53 to TP55. The transistor TP55 is controlled by the signal BLOADON and functions as a switch of the current mirror CMR. Gates of the transistors TP53 and TP54 are connected in common to the bit line BLRi. The transistors TP53 and TP54, which are almost equal in size (W/L), supply equal current from the power supply VBLH to the bit line BLRi and the sense node SNRi. In the current mirror CMR, the transistor TP54 can be made larger in size than the transistor TP53, similarly to the current mirror CML. The sensing speed of the sense amplifier S/A can be thereby accelerated.

The current mirrors CML and CMR are configured to transmit HIGH/LOW to the sense nodes SNLi and SNRi when the bit lines BLLi and BLRi are LOW/HIGH, respectively. Namely, in the fifth embodiment, the sense node SNLi stores therein not the inverted signal of the data stored in the memory cell MC but the non-inverted signal thereof. Due to this, the transfer gate TGL2 is connected between the bit line BLLi and the sense node SNLi, and the transfer gate TGR2 is connected between the bit line BLRi and the sense node SNRi.

In the dummy cell method, if the sense nodes are connected to the bit line during the data read operation as described in the first to the fourth embodiments, the amplification by the flip-flop FF1 causes potential changes in the sense nodes SNLi and SNRi. This possibly influences the current applied to the dummy cell DC. This also causes a disadvantage of an instable reference potential.

In the fifth embodiment, therefore, the sense nodes SNLi and SNRi are separated from the bit lines BLLi and BLRi, and the current mirrors CML and CMR apply the currents based on potentials of the bit lines BLLi and BLRi to the sense nodes SNLi and SNRi. By doing so, the potential changes in the sense nodes SNLi and SNRi are not transmitted to the bit lines BLLi and BLRi. As a result, the sense amplifier S/A even based on the dummy cell method according to the fifth embodiment can maintain the reference potential stable.

Figure 15:
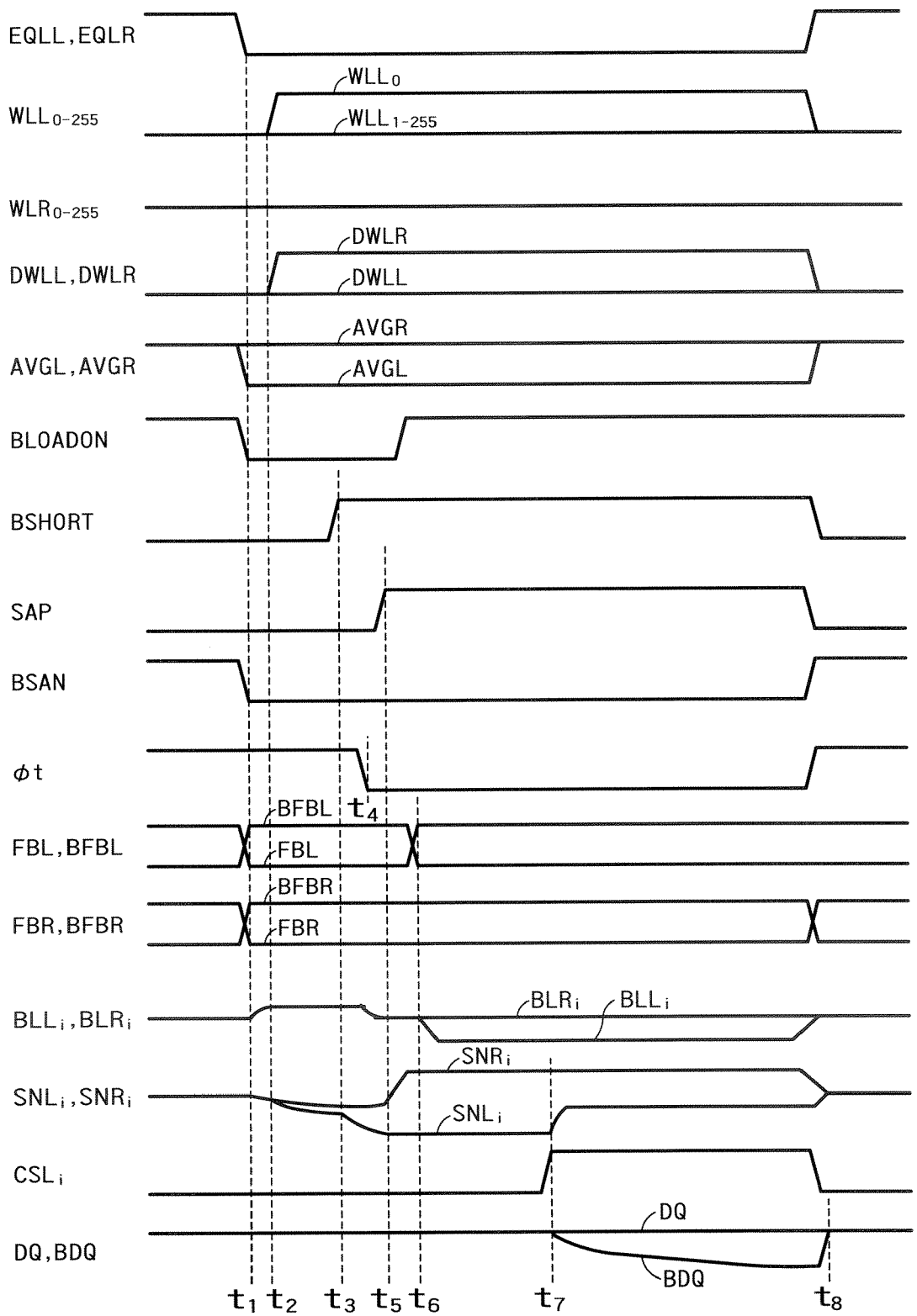
FIG. 15 is a timing chart showing the data read operation performed by the sense amplifier S/A according to the fifth embodiment.

FIG. 15 is a timing chart showing the data read operation performed by the sense amplifier S/A according to the fifth embodiment. A signal BLOADON is activated to LOW during timings t1 to t6 in the data read operation. The signal BLOADON thereby drives the current mirrors CML and CMR during the data read operation. During operations other than the data read operation, the current mirrors CML and CMR are inactive.

The signals SAP and BSAN operate similarly to the signals BSAN and SAP shown in FIG. 4, respectively.

It is to be noted that a timing chart showing the data write operation according to the fifth embodiment is the same as the timing chart shown in FIG. 5 except that the signal BLOADON and the averaging lines AVGL and AVGR shown in FIG. 15 are added, and that the signals SAP and BSAN and the sense nodes SNLi and SNRi shown in FIG. 5 are replaced by those shown in FIG. 15. Since the data write operation can be easily analogized from FIGS. 5 and 13, it will not be explained herein.

The sense amplifier S/A according to the fifth embodiment includes more elements than those according to the first to the fourth embodiments. The sense amplifier S/A according to the fifth embodiment is advantageous over those according to the first to the fourth embodiments in that the dummy cell method can be adopted. According to the dummy cell method, the dummy cell DC has the same FBC structure as that of the memory cell MC. Characteristics of the dummy cell DC, therefore, change to follow changes in the characteristics of the memory cell MC due to a change in the operating temperature, a change in the operating voltage, and process irregularity. Namely, the characteristics of the dummy cell DC correspond to those of the memory cell MC in self-alignment. As a result, the sense amplifier S/A can supply an accurate reference current to the memory cell MC.

In the above embodiments, the transistor used as the short-circuiting transistor is the PMOS transistor. Alternatively, an NMOS transistor can be used as the short-circuiting transistor. In this alternative, the signal SHORT which is the inverted signal of the signal BSHORT is input to the gate of the short-circuiting transistor.

The fifth embodiment can be combined with any one of the second to the fourth embodiments as follows. The fifth embodiment can thereby exhibit the same advantages as those of any one of the second to the fourth embodiments.

Figure 16:
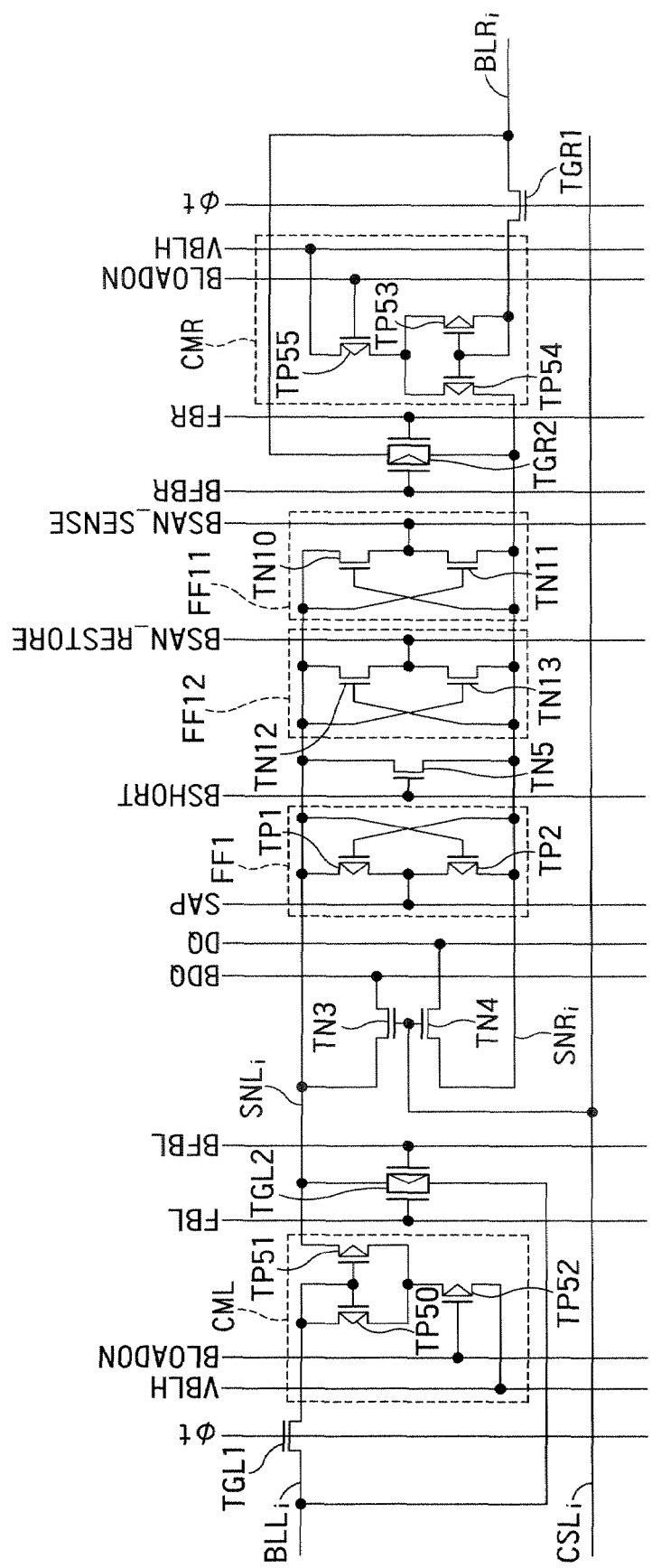
FIG. 16 is a circuit diagram of the configuration of a sense amplifier S/A obtained by combining the fifth embodiment with the second embodiment.

FIG. 16 is a circuit diagram of the configuration of a sense amplifier S/A obtained by combining the fifth embodiment with the second embodiment. Similarly to the fifth embodiment, in the sense amplifier S/A shown in FIG. 16, potentials equal in polarity to potentials of the bit lies BLLi and BLRi are transmitted to the sense nodes SNLi and SNRi, respectively. Therefore, the transistors constituting the flip-flops FF1, FF11, and FF12 shown in FIG. 16 are opposite in conduction type to those that constitute the flip-flops FF1, FF11, and FF12 shown in FIG. 8. The flip-flops FF1, FF11, and FF12 shown in FIG. 16 are controlled by inverted signals of the control signals for the flip-flops FF2, FF11, and FF12 shown in FIG. 8. Timing charts of the data read operation and the data write operation can be easily analogized from the second and the fifth embodiments. They will not be, therefore, explained herein. The configuration of the sense amplifier S/A shown in FIG. 16 enables the dummy cell method to be applied to the second embodiment.

Figure 17:
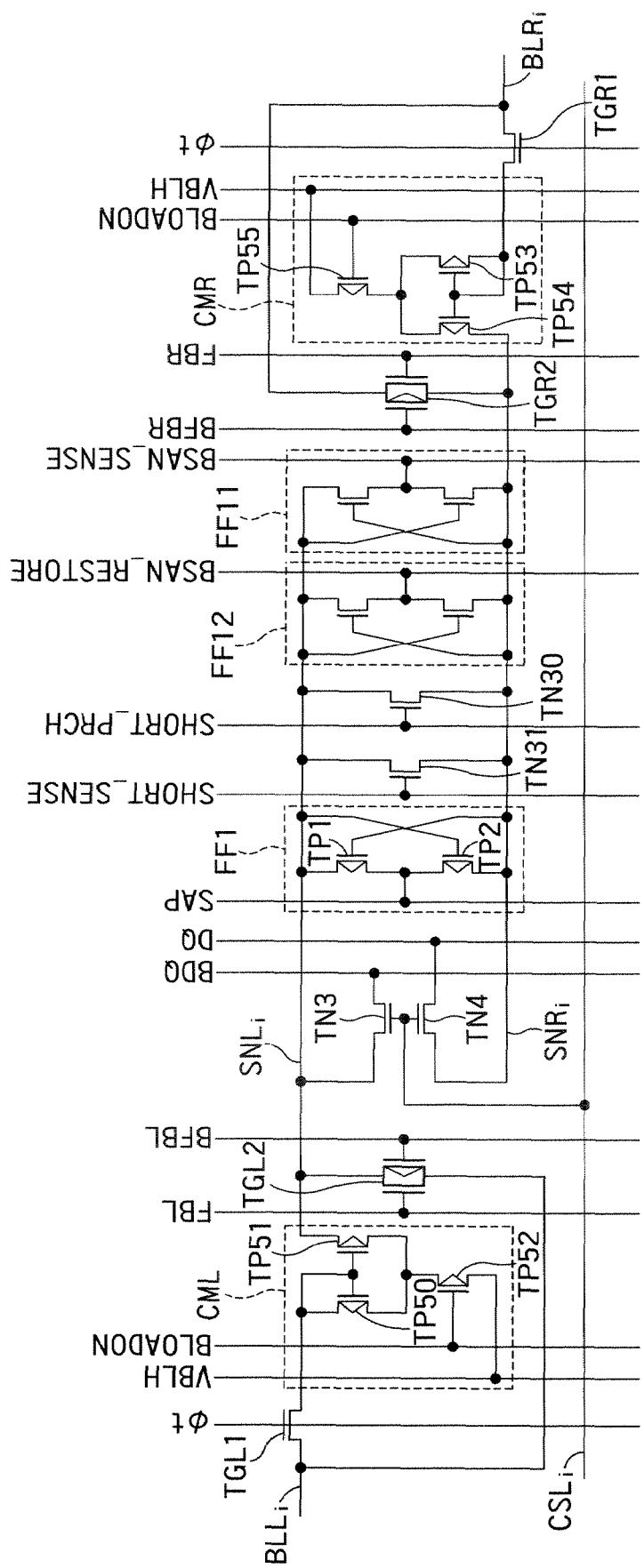
FIG. 17 is a circuit diagram of the configuration of a sense amplifier S/A obtained by combining the fifth embodiment with the third embodiment.

FIG. 17 is a circuit diagram of the configuration of a sense amplifier S/A obtained by combining the fifth embodiment with the third embodiment. The sense amplifier S/Ai shown in FIG. 17 differs from that shown in FIG. 16 in that two NMOS transistors TN30 and TN31 are used in place of the short-circuiting transistor TN5 shown in FIG. 16. The transistors TN30 and TN31 are controlled by inverted signals of the signals BSHT_PRCH and BSHT_SENSE shown in FIG. 10. Timing charts of the data read operation and the data write operation shown in FIG. 17 can be easily analogized from the third and the fifth embodiments. They will not be, therefore, explained herein. The configuration of the sense amplifier S/A shown in FIG. 17 enables the dummy cell method to be applied to the third embodiment.

Figure 18:
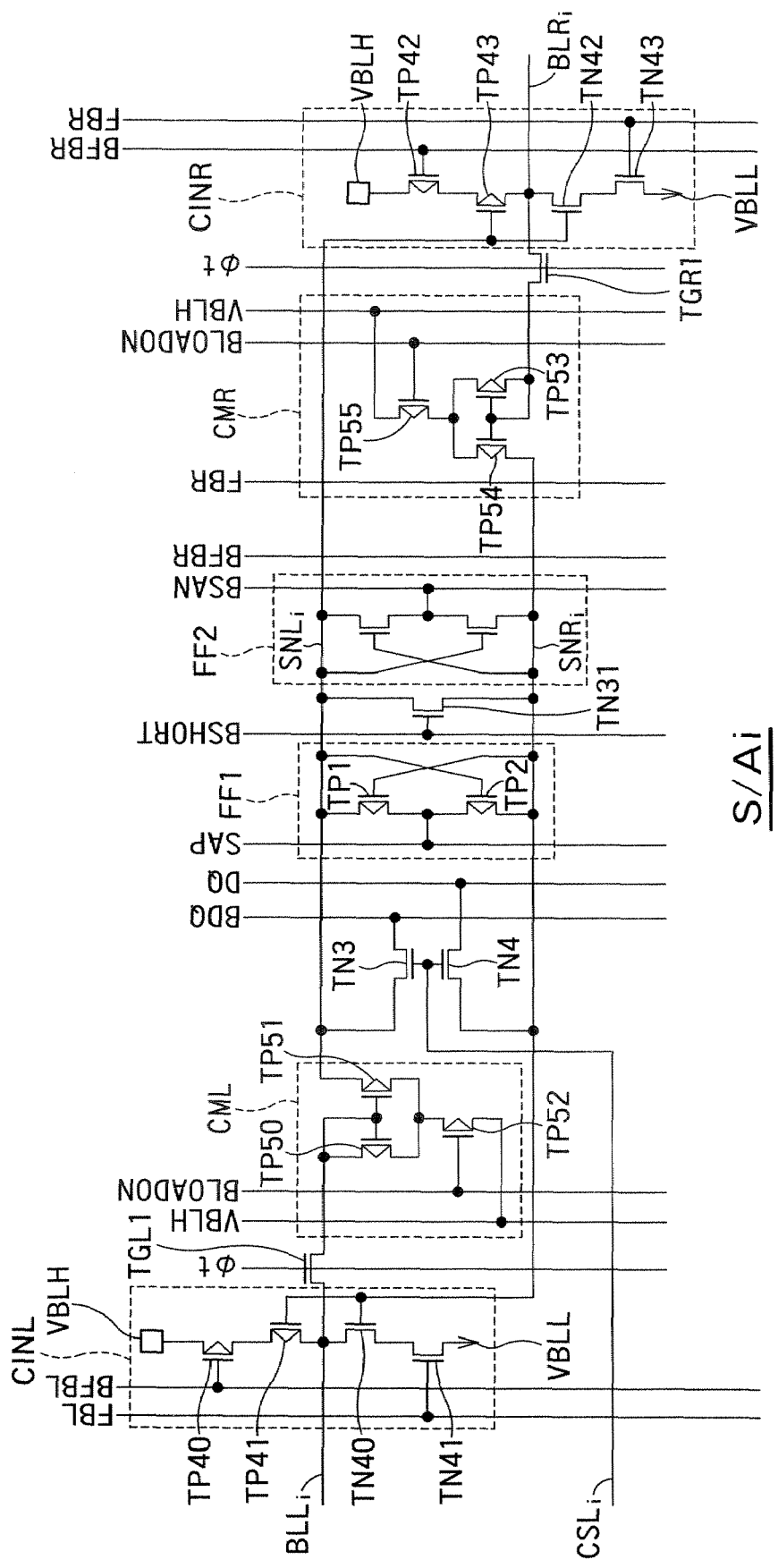
FIG. 18 is a circuit diagram of the configuration of a sense amplifier S/A obtained by combining the fifth embodiment with the fourth embodiment.

FIG. 18 is a circuit diagram of the configuration of a sense amplifier S/A obtained by combining the fifth embodiment with the fourth embodiment. The sense amplifier S/Ai shown in FIG. 18 does not include the transfer gates TGR2 and TGL2. Furthermore, the sense amplifier S/Ai shown in FIG. 18 includes the first clocked inverter CINL and the second clocked inverter CINR. The first clocked inverter CINL is connected in parallel to the first transfer gate TGL1 between the first bit line BLLi and the first sense node SNLi. The second clocked inverter CINR is connected in parallel to the second transfer gate TGR1 between the second bit line BLRi and the second sense node SNRi. The other configurations of the sense amplifier S/Ai shown in FIG. 18 can be the same as those according to the fifth embodiment. Timing charts of the data read operation and the data write operation shown in FIG. 18 can be easily analogized from the fourth and the fifth embodiments. They will not be, therefore, explained herein. The configuration of the sense amplifier S/A shown in FIG. 18 enables the dummy cell method to be applied to the fourth embodiment.

In the fifth embodiment, if the manufacturing process is managed so that irregularities among the transistors constituting the sense amplifier S/A are sufficiently small, the order of timings t1, t2, and t3 can be set as desired similarly to the first embodiment. Needless to say, the timings t1, t2, and t3 can be set equal, i.e., t1=t2=t3.

SIXTH EMBODIMENT

Figure 19:
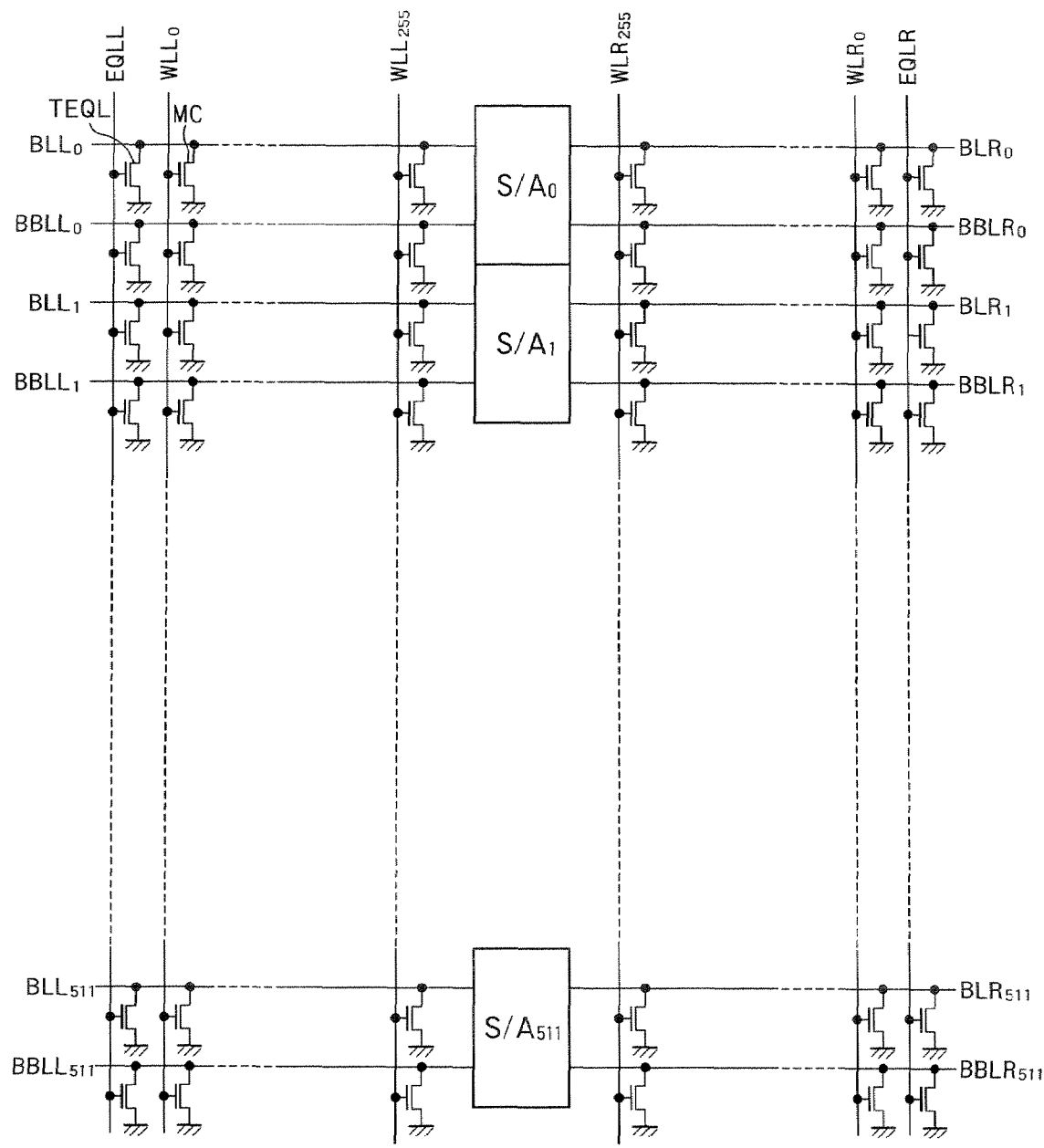
FIG. 19 is a circuit diagram of the configuration of an FBC memory device according to a sixth embodiment of the present invention.

FIG. 19 is a circuit diagram of the configuration of an FBC memory device according to a sixth embodiment of the present invention. The FBC memory device according to the sixth embodiment differs from those according to the preceding embodiments in that a two-cell/bit structure is adopted. The "two-cell/bit structure" refers to a structure of storing one-bit data by writing complementary data to two memory cells MC which are connected to paired bit lines BLLi and BBLLi or paired bit lines BLRi and BBLRi and which are adjacent to each other on the same word line. The "complementary data" refers to two pieces of data opposite in polarity, which data has the relation between the data "0" and the data "1". In the data read operation, one of the complementary data is set as reference data with respect to the other data, and the other data is set as reference data with respect to the one data.

Figure 20:
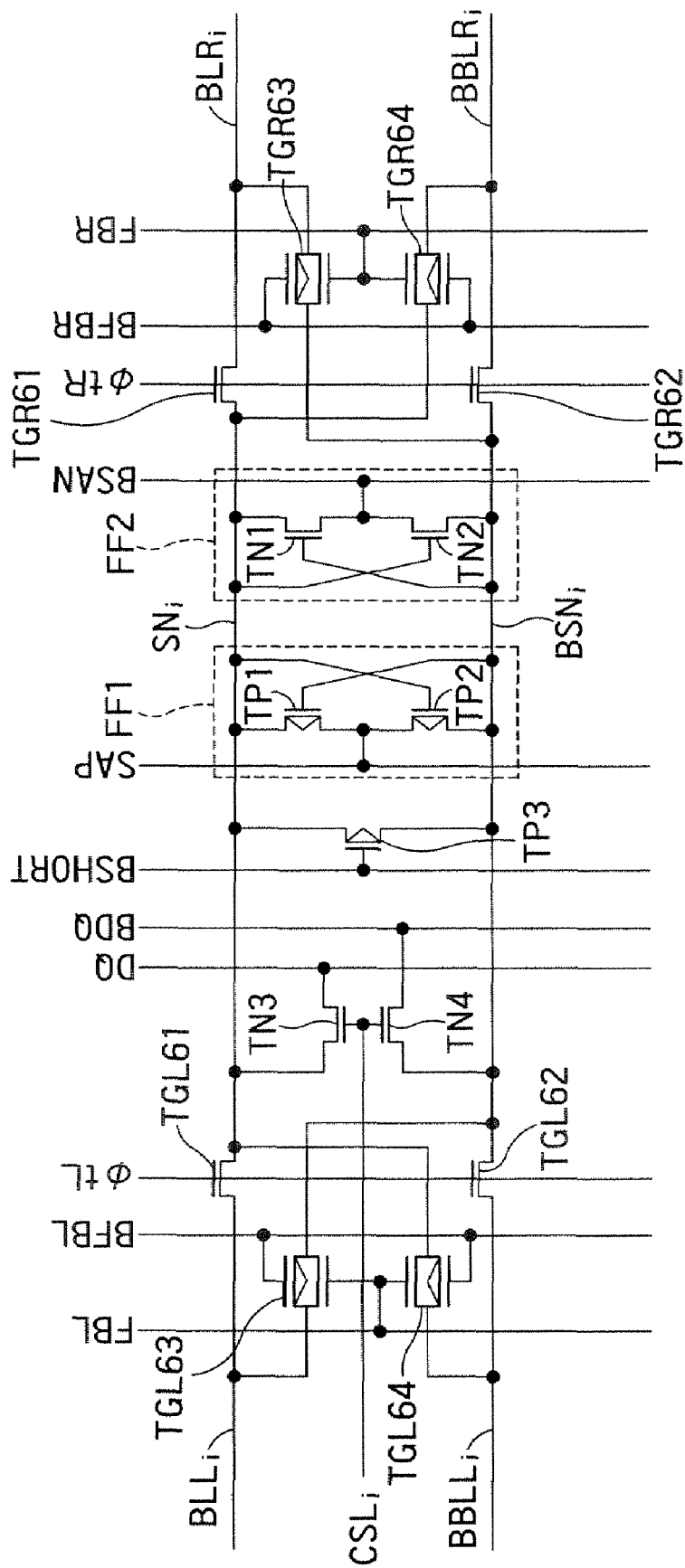
FIG. 20 is a circuit diagram of the configuration of a sense amplifier S/Ai.

FIG. 20 is a circuit diagram of the configuration of a sense amplifier S/Ai. The sense amplifier S/Ai according to the sixth embodiment differs from that according to the first embodiment in that the sense amplifier S/Ai includes transfer gates TGL61 to TGL64 and TGR61 to TGR64. The other configurations of the sense amplifier S/Ai according to the sixth embodiment can be the same as those according to the first embodiment. The transfer gate TGL61 is connected between the bit line BLLi and the sense node SNi. The transfer gate TGL62 is connected between the bit line BBLLi and a sense node BSNi. The transfer gate TGL63 is connected between the bit line BLLi and the sense node BSNi. The transfer gate TGL64 is connected between the bit line BBLLi and the sense node SNi. The transfer gate TGR61 is connected between the bit line BLRi and the sense node SNi. The transfer gate TGR62 is connected between the bit line BBLRi and the sense node BSNi. The transfer gate TGR63 is connected between the bit line BLRi and the sense node BSNi. The transfer gate TGR64 is connected between the bit line BBLRi and the sense node SNi.

Figure 21:
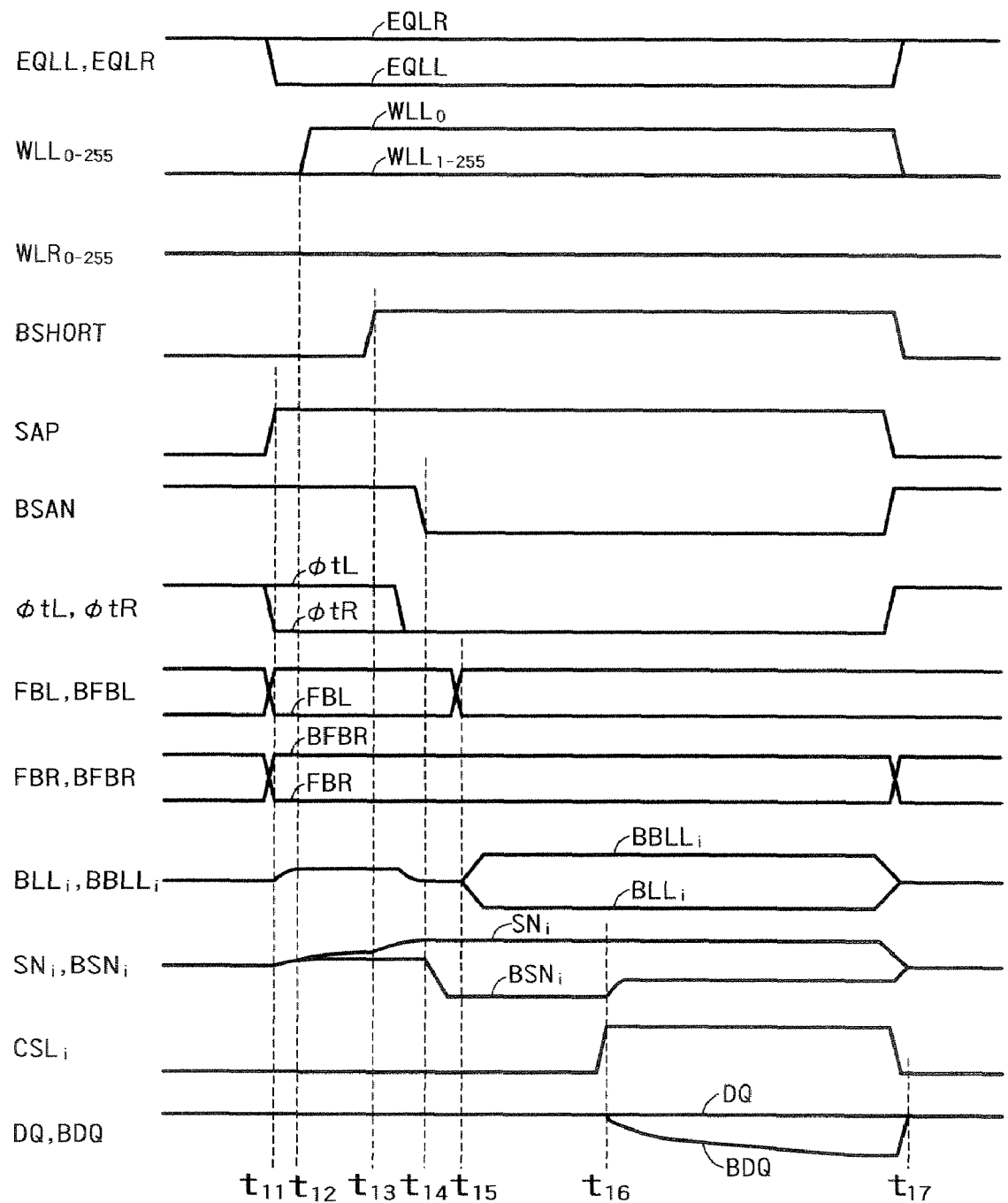
FIG. 21 is a timing chart showing the data read operation performed by the sense amplifier S/Ai according to the sixth embodiment.

FIG. 21 is a timing chart showing the data read operation performed by the sense amplifier S/Ai according to the sixth embodiment. Before timing t11, the sense amplifier S/Ai is in a precharged state. At timing t12, when the word line WLL0 is selected, a signal ΦtL remains active and a signal ΦtR is inactive. The transfer gates TGR61 and TGR62 are thereby turned off.

During timings t11 to t14, after data is detected, the signal ΦtL is inactivated as described in the first embodiment. The sense nodes SNi and BSNi are thereby disconnected from the bit lines BLLi, BBLLi, BLRi, and BBLRi.

After the timing t13, the sense amplifier S/Ai operates similarly to that according to the first embodiment.

Since the data write operation performed by the sense amplifier S/Ai according to the sixth embodiment can be easily analogized from FIGS. 5 and 19, it will not be explained herein.

In the sixth embodiment, if the manufacturing process is managed so that irregularities among the transistors constituting the sense amplifier S/A are sufficiently small, the order of timings t11, t12, and t13 can be set as desired similarly to the first embodiment. Needless to say, the timings t11, t12, and t13 can be set equal, i.e. t11=t12=t13.

A Modification of the Sixth Embodiment

Figure 22:
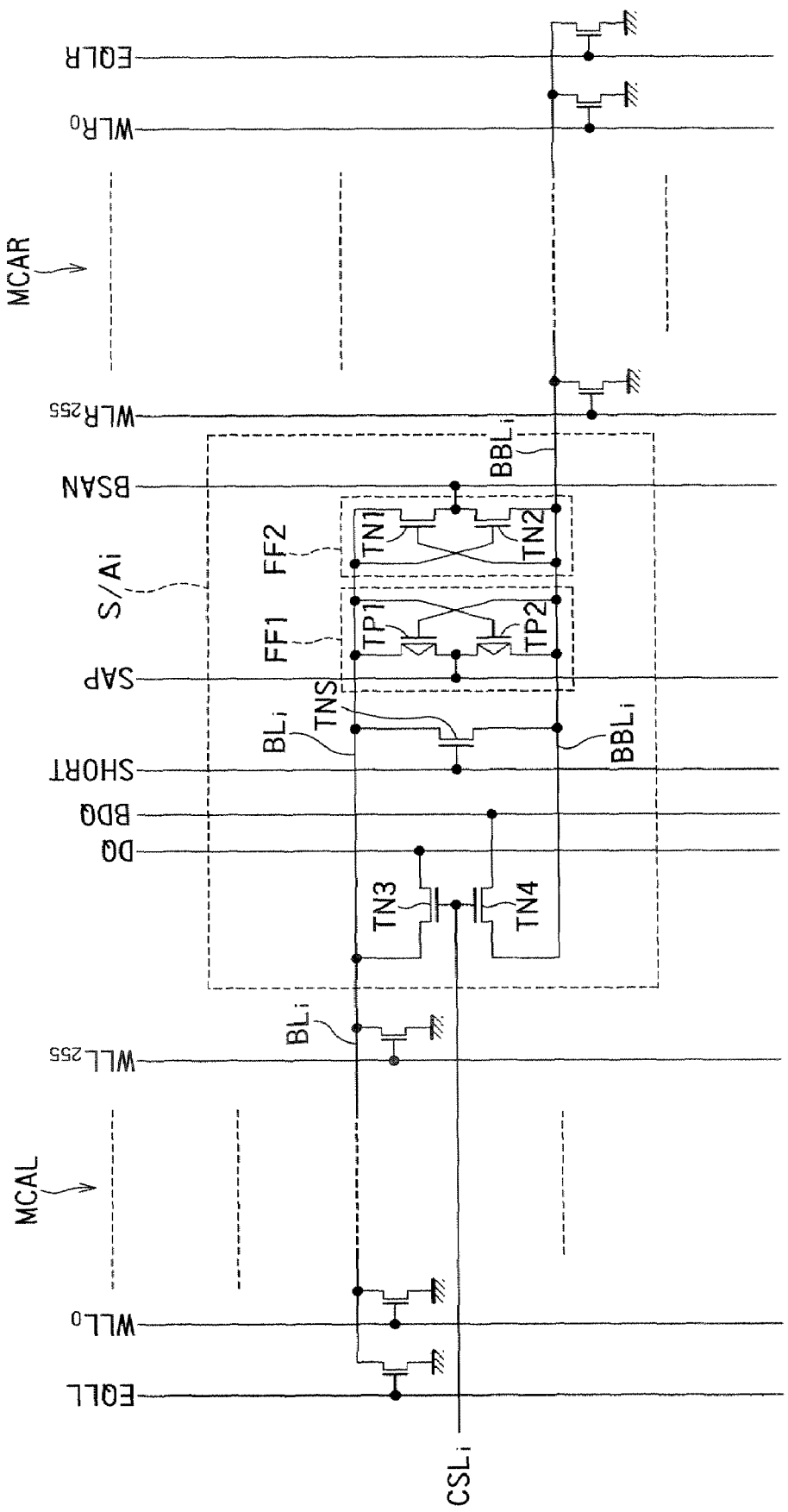
FIG. 22 is a circuit diagram of a sense amplifier S/A according to a modification of the sixth embodiment.
Figure 23:
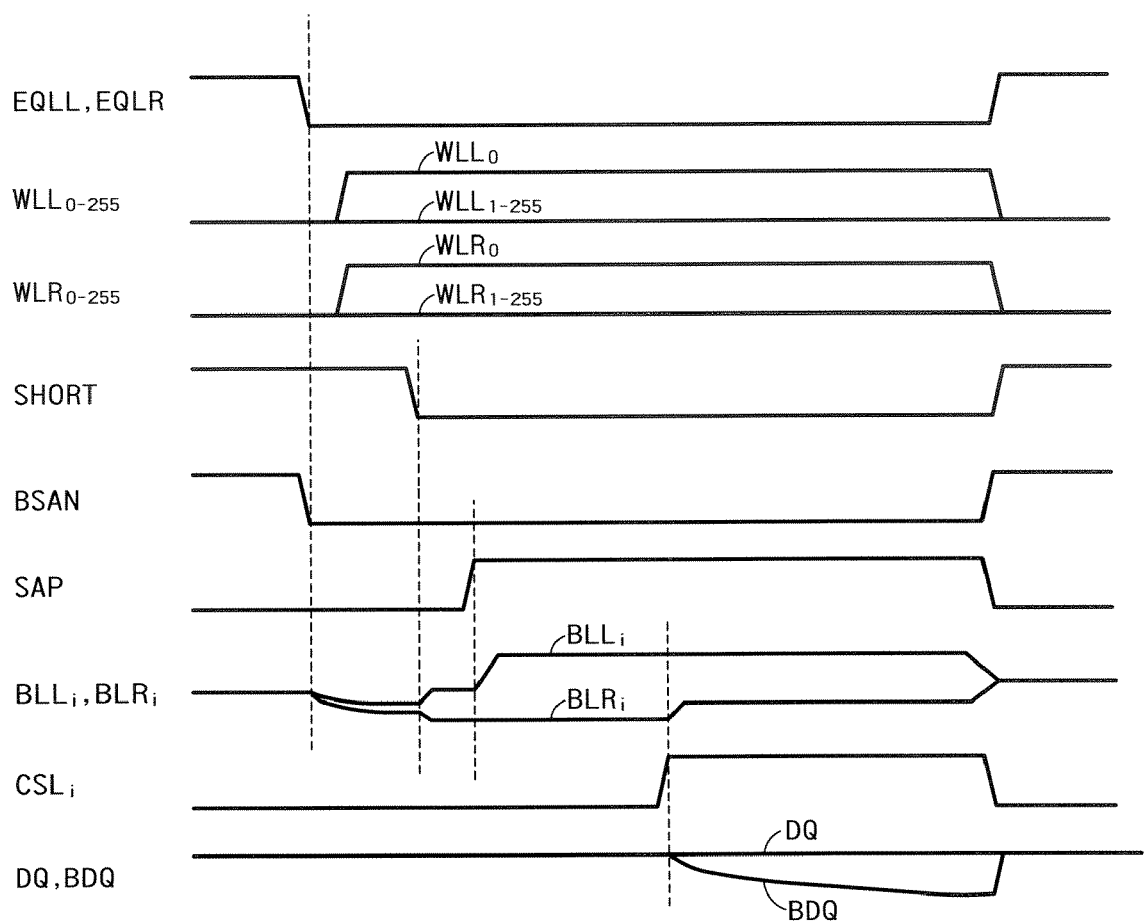
FIG. 23 shows a timing chart of an operation of a sense amplifier S/A according to a modification of the sixth embodiment.

FIG. 22 is a circuit diagram of a sense amplifier S/A according to a modification of the sixth embodiment. And FIG. 23 shows a timing chart of its operation. As shown in this modification, it is possible to connect a sense amplifier directly to a pair of bit lines and to amplify the signal on the bit lines. That is, the sense amplifier S/A does not have sense nodes SN and SNB and the transfer gates TGL1, TGL2, TGRL and TGR2.

Further, this modification is different from the sixth embodiment at a point that a sense amplifier S/A of the modification is connected to a bit line BL on one side thereof and to a bit line BBL on another side thereof. However, the sense amplifier S/A senses data on the bit line BL using data on the bit line BBL as a reference, and senses data on the bit line BBL using data on the bit line BL as a reference. Therefore, this modification has a two-cell/bit structure same as the sixth embodiment.

As shown in FIG. 23, the flip-flop FF1 in this modification amplifies data in a situation that the short-circuiting switch TNS short-circuits the bit line BL to the bit line BBL. Then, the short-circuiting switch TNS disconnects the bit line BL from the bit line BBL after or simultaneously with amplification of the data. This operation is same as the operation of the sixth embodiment.

As a result, the modification can obtain the same advantages of the sixth embodiment described above.

SEVENTH EMBODIMENT

Figure 24:
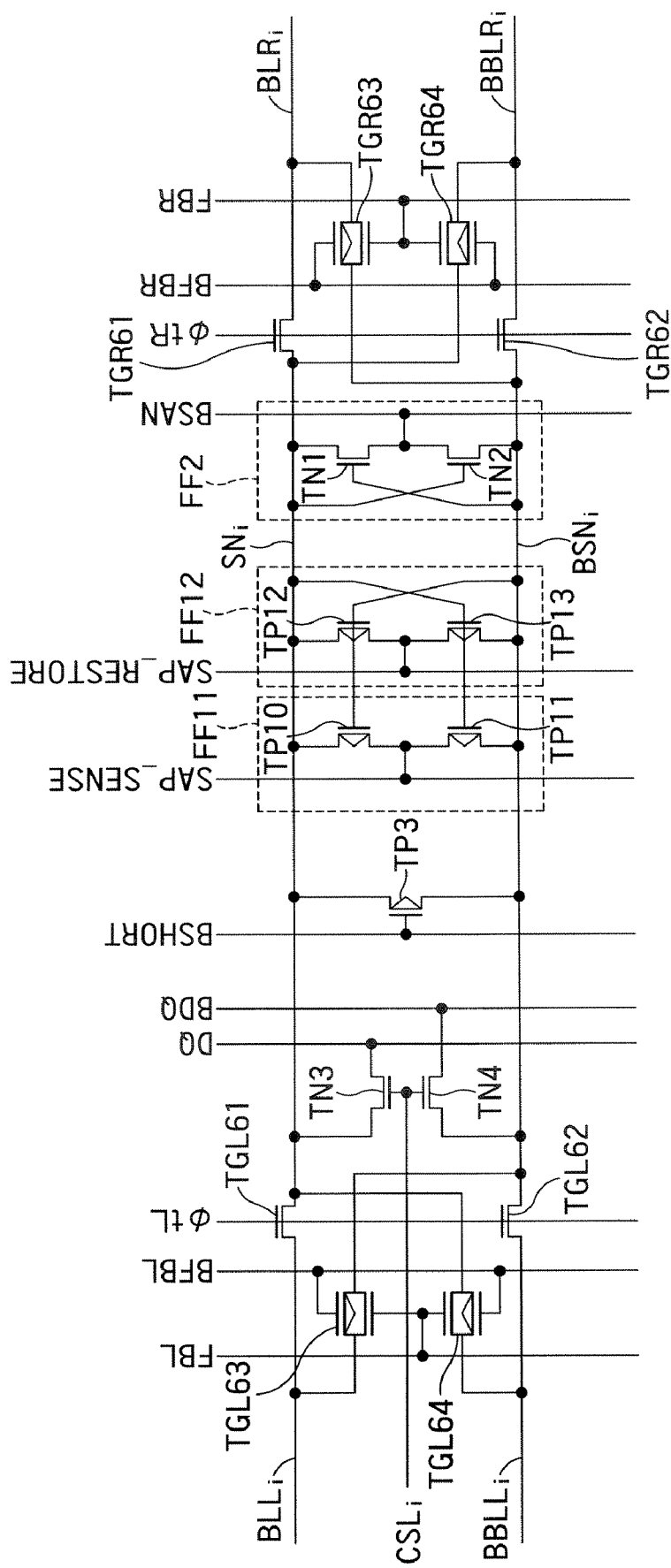
FIG. 24 is a circuit diagram of the configuration of a sense amplifier S/Ai according to a seventh embodiment of the present invention.

FIG. 24 is a circuit diagram of the configuration of a sense amplifier S/Ai according to a seventh embodiment of the present invention. The seventh embodiment is a combination of the sixth and the second embodiments. The sense amplifier S/Ai according to the seventh embodiment differs from that according to the sixth embodiment in that the sense amplifier S/Ai includes the first flip-flop FF11 and the second flip-flop FF12 instead of the flip-flop FF1 shown in FIG. 20. The other configurations of the sense amplifier S/Ai according to the seventh embodiment shown in FIG. 24 can be the same as those according to the sixth embodiment.

Figure 25:
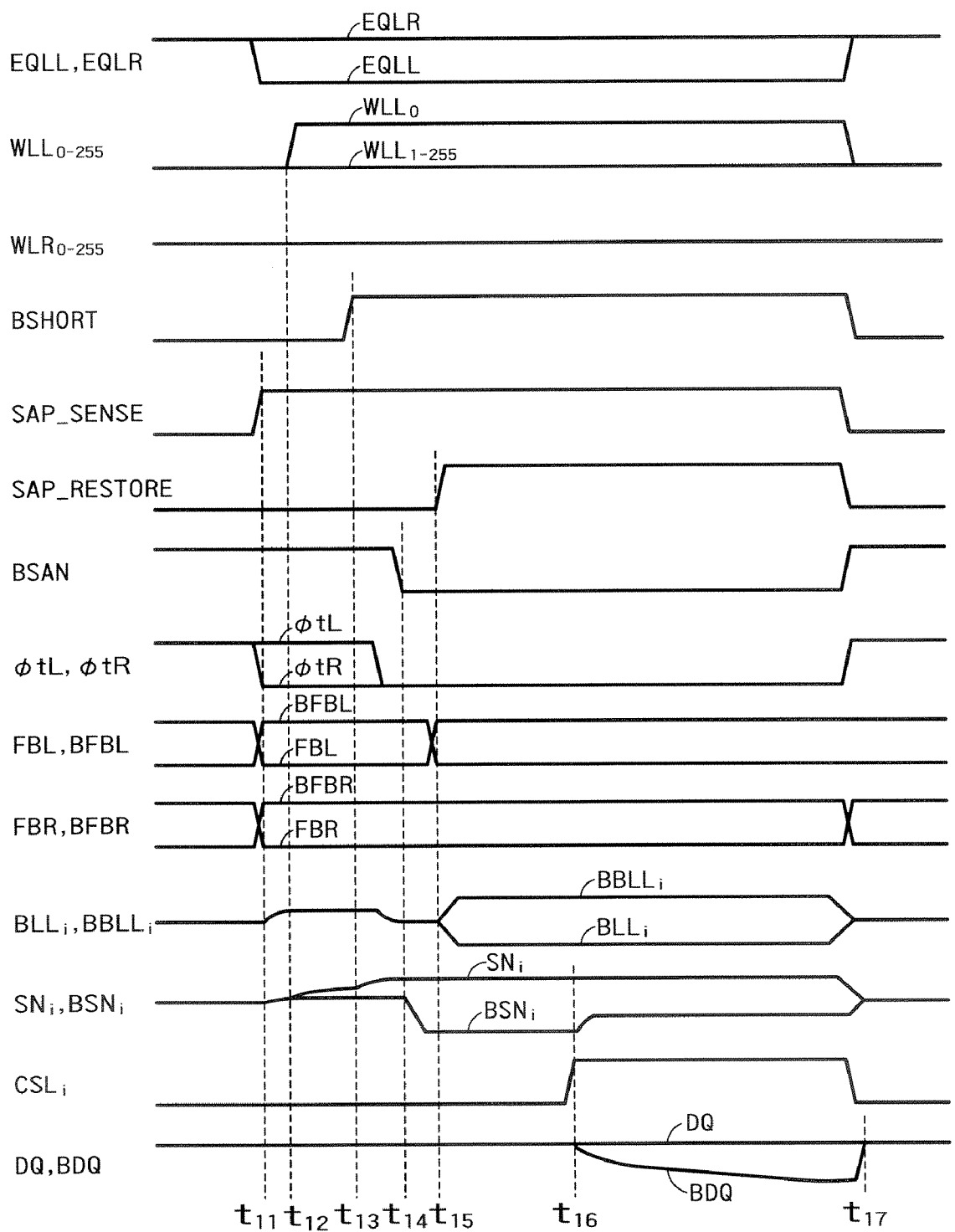
FIG. 25 is a timing chart showing the data read operation performed by the sense amplifier S/Ai according to the seventh embodiment.

FIG. 25 is a timing chart showing the data read operation performed by the sense amplifier S/Ai according to the seventh embodiment. Since the data read operation shown in FIG. 25 can be easily analogized from FIGS. 7 and 19, it will not be explained herein.

In the seventh embodiment, if the manufacturing process is managed so that irregularities among the transistors constituting the sense amplifier S/A are sufficiently small, the order of timings t1, t2, and t3 can be set as desired similarly to the first embodiment. Needless to say, the timings t1, t2, and t3 can be set equal, i.e., t1=t2=t3.

EIGHTH EMBODIMENT

Figure 26:
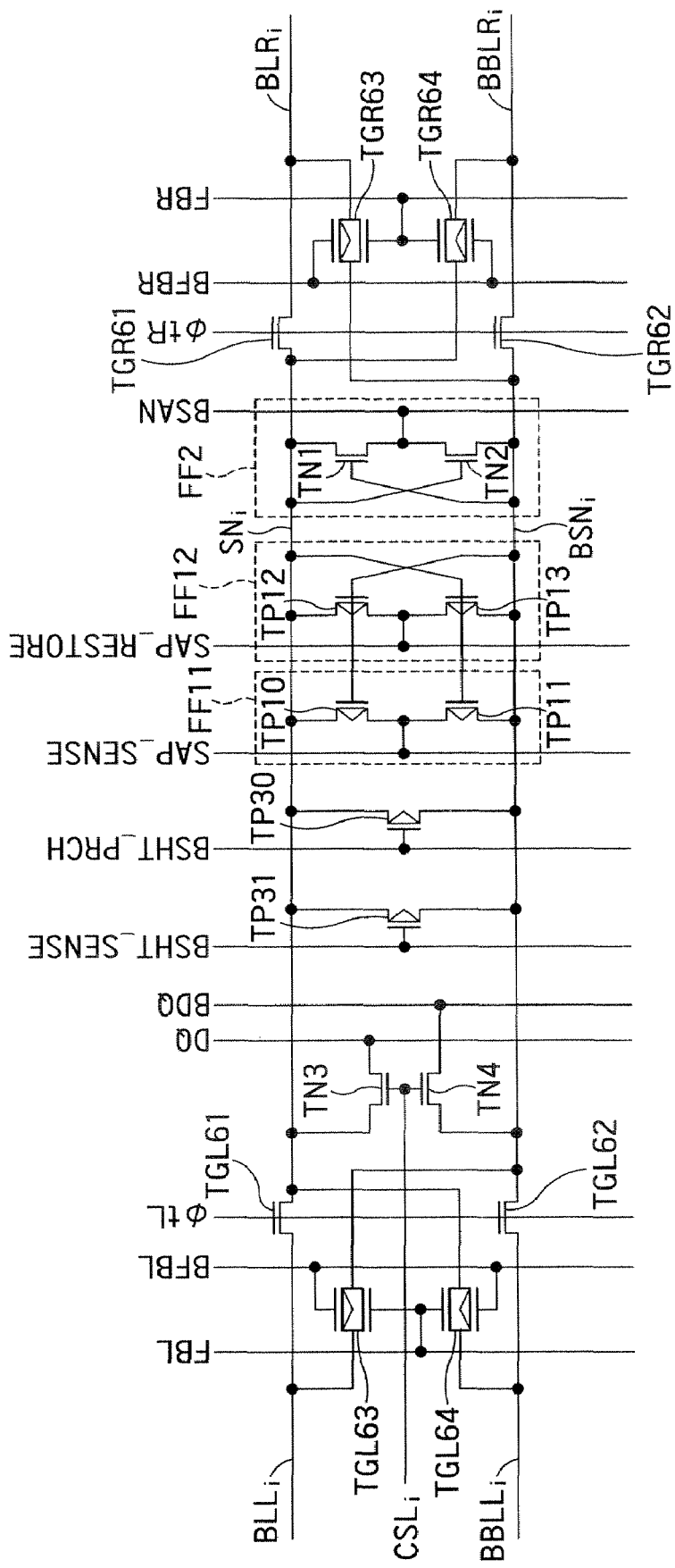
FIG. 26 is a circuit diagram of the configuration of a sense amplifier S/Ai according to an eighth embodiment of the present invention.

FIG. 26 is a circuit diagram of the configuration of a sense amplifier S/Ai according to an eighth embodiment of the present invention. The eighth embodiment is a combination of the seventh and the third embodiments. The sense amplifier S/Ai according to the eighth embodiment differs from that according to the seventh embodiment in that the sense amplifier S/Ai includes the PMOS transistor TP30 serving as the first short-circuiting switch and the PMOS transistor TP31 serving as the second short-circuiting switch instead of the PMOS transistor TP3 shown in FIG. 24. The other configurations of the sense amplifier S/Ai according to the eighth embodiment can be the same as those according to the seventh embodiment.

Figure 27:
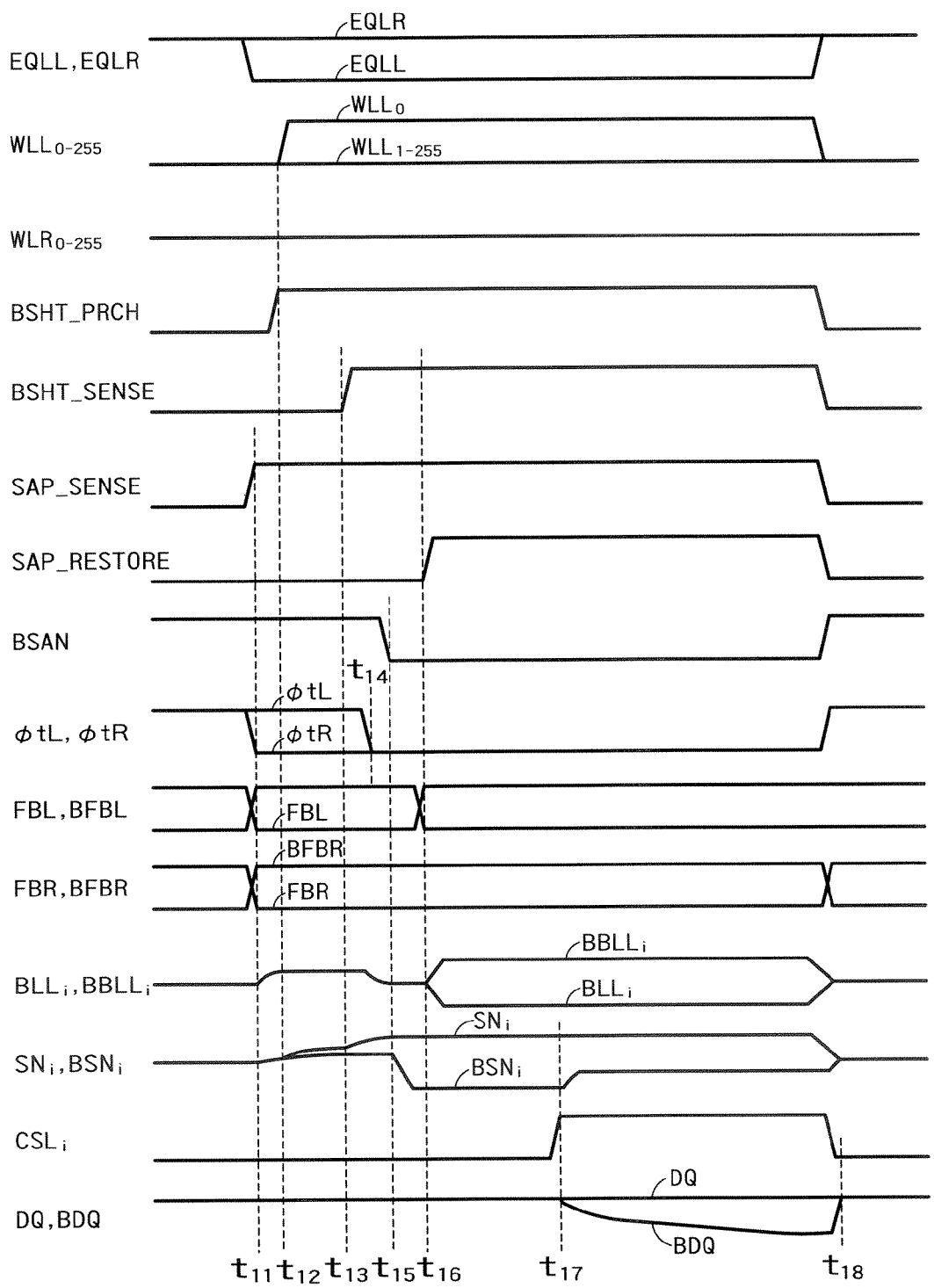
FIG. 27 is a timing chart showing the data read operation performed by the sense amplifier S/Ai according to the eighth embodiment.

FIG. 27 is a timing chart showing the data read operation performed by the sense amplifier S/Ai according to the eighth embodiment. Since the data read operation shown in FIG. 27 can be easily analogized from FIGS. 9 and 19, it will not be explained herein.

NINTH EMBODIMENT

Figure 28A:
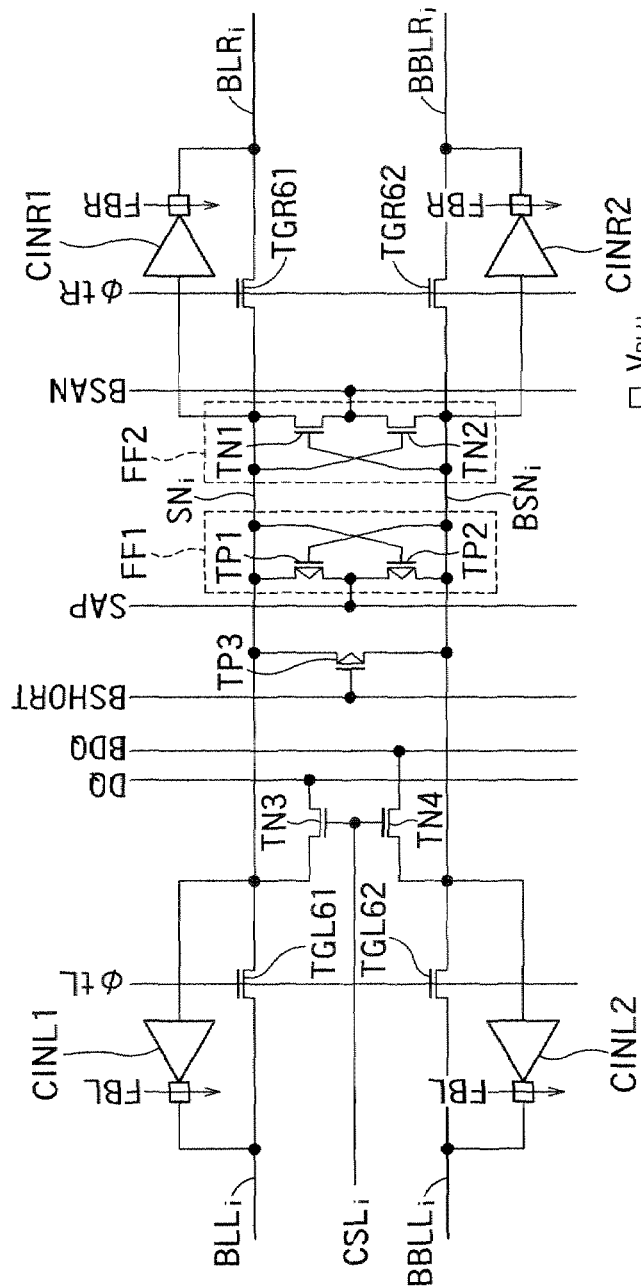
FIG. 28A is a circuit diagram of the configuration of a sense amplifier S/Ai according to a ninth embodiment of the present invention.
Figure 28C:
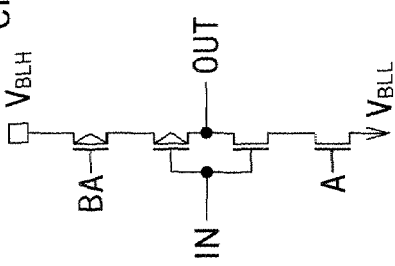
FIGS. 28B and 28C are circuit diagrams of the clocked inverter.
Figure 28B:
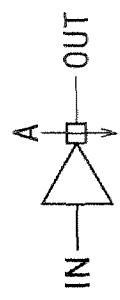

FIG. 28A is a circuit diagram of the configuration of a sense amplifier S/Ai according to a ninth embodiment of the present invention. The ninth embodiment is a combination of the sixth and the fourth embodiments. The sense amplifier S/Ai according to the ninth embodiment differs from that shown in FIG. 20 in that the sense amplifier S/Ai does not include the transfer gates TGL63, TGL64, TGR63, and TGR64. Furthermore, the sense amplifier S/Ai according to the ninth embodiment includes clocked inverters CINL1, CINL2, CINR1, and CINR2. The clocked inverter CINL1 is connected in parallel to the transfer gate TGL61 between the bit line BLLi and the sense node SNi. The clocked inverter CINL2 is connected in parallel to the transfer gate TGL62 between the bit line BBLLi and the sense node BSNi. The clocked inverter CINR1 is connected in parallel to the transfer gate TGR61 between the bit line BLRi and the sense node SNi. The clocked inverter CINR2 is connected in parallel to the transfer gate TGR62 between the bit line BBLRi and the sense node BSNi. The other configurations of the sense amplifier S/Ai according to the ninth embodiment can be the same as those according to the sixth embodiment shown in FIG. 20. The clocked inverter shown in FIG. 28B is used in the sense amplifier S/Ai shown in FIG. 28A. The clocked inverter shown in FIG. 28C is a circuit diagram of the clocked inverter shown in FIG. 28B.

Figure 29:
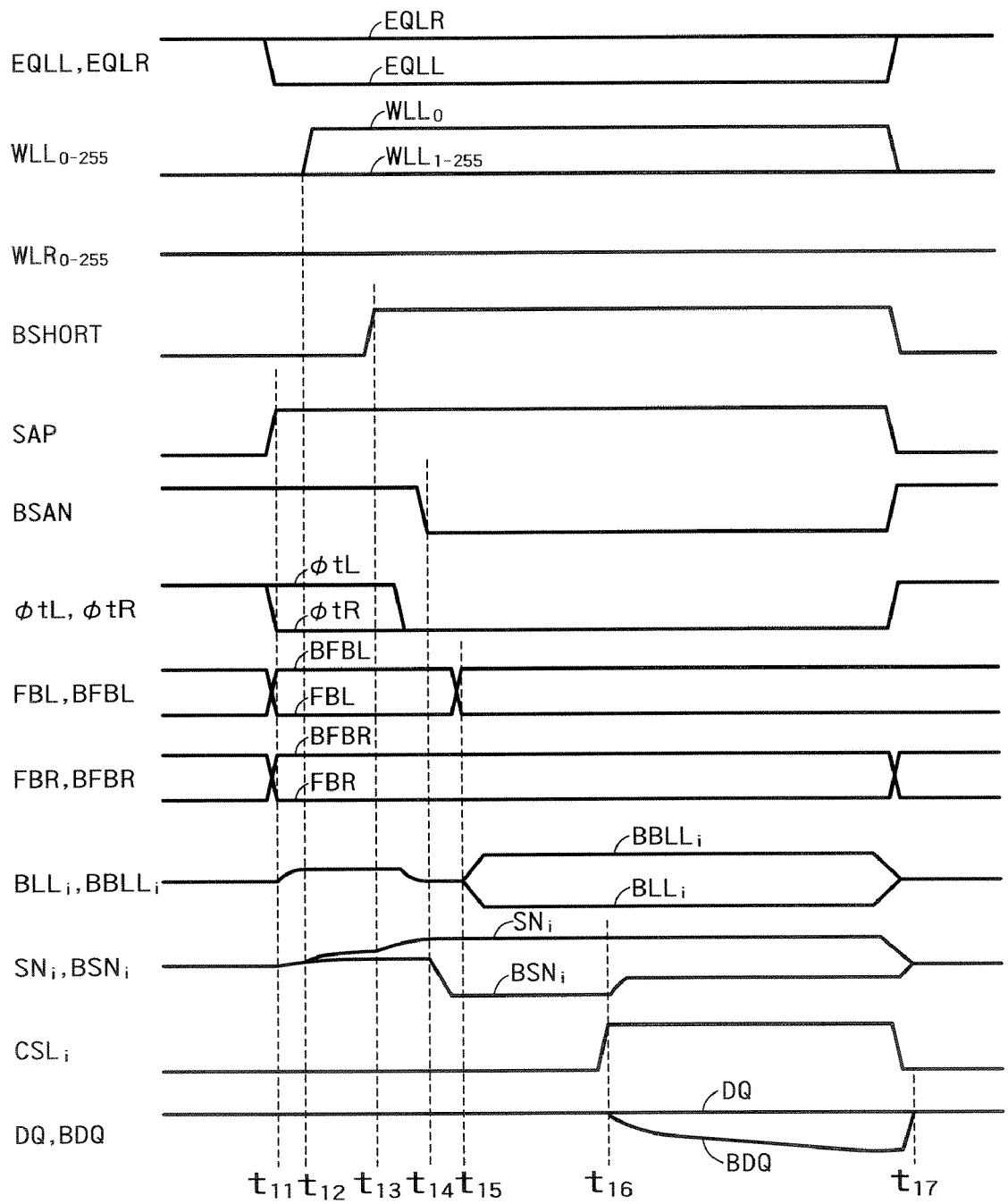
FIG. 29 is a timing chart showing the data read operation performed by the sense amplifier S/Ai according to the ninth embodiment.

FIG. 29 is a timing chart showing the data read operation performed by the sense amplifier S/Ai according to the ninth embodiment. Since the data read operation shown in FIG. 29 can be easily analogized from FIG. 21 and the fourth embodiment, it will not be explained herein.

Similarly to the sixth to the ninth embodiments, the first to the fourth embodiments can be applied to the FBC memory device based on the two-cell/bit structure.

In the ninth embodiment, if the manufacturing process is managed so that irregularities among the transistors constituting the sense amplifier S/A are sufficiently small, the order of timings t11, t12, and t13 can be set as desired similarly to the first embodiment. Needless to say, the timings t11, t12, and t13 can be set equal, i.e. t11=t12=t13.

The invention claimed is:
1. A semiconductor memory device comprising:
a first memory cell including a floating body in an electrically floating state and storing data according to the number of majority carriers in the floating body;
a word line connected to a gate of the first memory cell;
a first bit line connected to the first memory cell to transmit the data stored in the first memory cell;
a second bit line transmitting reference data used to detect the data stored in the first memory cell;
a first sense node and a second sense node transmitting the data stored in the first memory cell and the reference data, respectively;
a first short-circuiting switch provided between the first sense node and the second sense node; and a first flip-flop detecting a potential difference generated between the first sense node and the second sense node in a data read operation, wherein in the data read operation, the first short-circuiting switch is in a turn-on state at a time when the first flip-flop is actuated to start detecting the potential difference, and the first short-circuiting switch is turned off while the first flip-flop is in an active state.

2. The semiconductor memory device according to claim 1, further comprising:
a second flip-flop connected between the first sense node and the second sense node and starting operating when the data is written to the first memory cell.

3. The semiconductor memory device according to claim 1, further comprising:
a second flip-flop connected between the first sense node and the second sense node and starting operating when the data is written to the first memory cell.

4. The semiconductor memory device according to claim 1, further comprising:
a second short-circuiting switch provided between the first sense node and the second sense node and disconnecting the first sense node from the second sense node before the first flip-flop starts a data amplification operation.

5. The semiconductor memory device according to claim 1, further comprising:
a first transfer gate provided between the first bit line and the first sense node;
a second transfer gate provided between the second bit line and the second sense node;
a first inverter connected in parallel to the first transfer gate between the first bit line and the first sense node and driven during a data write operation; and
a second inverter connected in parallel to the second transfer gate between the second bit line and the second sense node and driven during the data write operation.

6. The semiconductor memory device according to claim 1, further comprising:
a dummy cell generating the reference data;
a first current-mirror circuit connected between the first bit line and the first sense node and transmitting data on the first bit line to the first sense node during the data read operation; and
a second current-mirror circuit connected between the second bit line and the second sense node and transmitting data on the second bit line to the second sense node during the data read operation, wherein
the first or the second bit line transmits the reference data during the data read operation.

7. The semiconductor memory device according to claim 1, further comprising:
a second memory cell including a floating body in an electrically floating state, and storing data according to the number of carriers in the floating body, the second memory cell storing the data opposite in polarity to the data stored in the first memory cell, wherein
the second bit line transmits the data stored in the second memory cell, and
the first flip-flop applies a load current to the first memory cell and the second memory cell during a data read operation and detecting a potential difference generated between the first sense node and the second sense node by turning off the first short-circuiting switch.

8. The semiconductor memory device according to claim 7, wherein the first flip-flop detects data in a situation that the first short-circuiting switch short-circuits the first sense node to the second sense node, and the first short-circuiting switch disconnects the first sense node from the second sense node after or simultaneously with amplification of the data.

9. The semiconductor memory device according to claim 8, further comprising:
a second flip-flop connected between the first sense node and the second sense node and starting operating when the data is written to the first and the second memory cells.

10. The semiconductor memory device according to claim 8, further comprising:
a first transfer gate provided between the first bit line and the first sense node;
a second transfer gate provided between the second bit line and the second sense node;
a first inverter connected in parallel to the first transfer gate between the first bit line and the first sense node and driven during a data write operation; and
a second inverter connected in parallel to the second transfer gate between the second bit line and the second sense node and driven during the data write operation.

11. The semiconductor memory device according to claim 7, further comprising:
a second flip-flop connected between the first sense node and the second sense node and starting operating when the data is written to the first and the second memory cells.

12. The semiconductor memory device according to claim 7, further comprising:
a second short-circuiting switch provided between the first sense node and the second sense node and disconnecting the first sense node from the second sense node before the first flip-flop starts a data amplification operation.

13. The semiconductor memory device according to claim 7, further comprising:
a first transfer gate provided between the first bit line and the first sense node;
a second transfer gate provided between the second bit line and the second sense node;
a first inverter connected in parallel to the first transfer gate between the first bit line and the first sense node and driven during a data write operation; and
a second inverter connected in parallel to the second transfer gate between the second bit line and the second sense node and driven during the data write operation.

14. A semiconductor memory device comprising:
a first memory cell including a floating body in an electrically floating state and storing data according to the number of majority carriers in the floating body;
a word line connected to a gate of the first memory cell;
a first bit line connected to the first memory cell to transmit the data stored in the first memory cell;
a second bit line transmitting reference data used to detect the data stored in the first memory cell;
a first short-circuiting switch provided between the first bit line and the second bit line; and
a first flip-flop detecting a potential difference generated between the first bit line and the second bit line in a data read operation,
wherein in the data read operation, the first short-circuiting switch is in a turn-on state at a time when the first flip-flop is actuated to start detecting the potential difference, and the first short-circuiting switch is turned off while the first flip-flop is in an active state.

15. The semiconductor memory device according to claim 14, further comprising:
a first transfer gate provided between the first bit line and the first sense node;

a second transfer gate provided between the second bit line and the second sense node;

a first inverter connected in parallel to the first transfer gate between the first bit line and the first sense node and driven during a data write operation; and a second inverter connected in parallel to the second transfer gate between the second bit line and the second sense node and driven during the data write operation.

16. The semiconductor memory device according to claim 14, further comprising:

a dummy cell generating the reference data;

a first current-mirror circuit connected between the first bit line and the first sense node and transmitting data on the first bit line to the first sense node during the data read operation; and a second current-mirror circuit connected between the second bit line and the second sense node and transmitting data on the second bit line to the second sense node during the data read operation, wherein the first or the second bit line transmits the reference data during the data read operation.

17. The semiconductor memory device according to claim 14, further comprising:

a second memory cell each including a floating body in an electrically floating state, and storing data according to the number of carriers in the floating body, the second memory cell storing the data opposite in polarity to the data stored in the first memory cell, wherein the second bit line transmits the data stored in the second memory cell, and the first flip-flop applies a load current to the first memory cell and the second memory cell during a data read operation and detecting a potential difference generated between the first bit line and the second bit line by turning off the first short-circuiting switch.

18. The semiconductor memory device according to claim 17, wherein the first flip-flop detects data in a situation that the first short-circuiting switch short-circuits the first bit line to the second bit line, and the first short-circuiting switch disconnects the first bit line from the second bit line after or simultaneously with amplification of the data.

* * * * *